United States Patent
Jiang et al.

(10) Patent No.: US 11,881,877 B2
(45) Date of Patent: Jan. 23, 2024

(54) SPUR COMPENSATION METHOD AND SYSTEM

(71) Applicant: Huawei Technologies Co., Ltd., Shenzhen (CN)

(72) Inventors: Hong Jiang, Kernsersville, NC (US); Wael Al-Qaq, Oak Ridge, NC (US); Zhihang Zhang, Cary, NC (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/653,521

(22) Filed: Mar. 4, 2022

(65) Prior Publication Data

US 2022/0190848 A1     Jun. 16, 2022

Related U.S. Application Data

(63) Continuation of application No. PCT/US2020/049507, filed on Sep. 4, 2020.

(30) Foreign Application Priority Data

Sep. 5, 2019 (WO) ................ PCT/US2019/049792

(51) Int. Cl.
    *H04B 1/00*          (2006.01)
    *H03D 7/16*          (2006.01)
    *H03L 7/18*          (2006.01)

(52) U.S. Cl.
    CPC ........... *H04B 1/0096* (2013.01); *H03D 7/163* (2013.01); *H03L 7/18* (2013.01)

(58) Field of Classification Search
    CPC ......... H04B 1/0096; H03D 7/163; H03L 7/18
    See application file for complete search history.

(56) References Cited

U.S. PATENT DOCUMENTS

| | | | |
|---|---|---|---|
| 6,385,442 B1 | 5/2002 | Vu et al. | |
| 7,148,758 B1 * | 12/2006 | Ross | ........................ H03L 7/093 |
| | | | 331/16 |
| 9,712,176 B1 * | 7/2017 | Rafi | ........................ H03L 7/093 |

(Continued)

FOREIGN PATENT DOCUMENTS

| | | |
|---|---|---|
| CN | 103441733 A | 12/2013 |
| CN | 105281674 A | 1/2016 |

(Continued)

*Primary Examiner* — Adam D Houston
(74) *Attorney, Agent, or Firm* — Slater Matsil, LLP

(57) ABSTRACT

A method includes producing a plurality of TX LO signals by a first LO generator comprising a first frequency doubler and a first frequency divider, the first frequency doubler configured to receive a VCO signal having a first frequency and generate a first signal fed into the first frequency divider, the first signal having a second frequency that is twice the first frequency, producing a plurality of MRX LO signals by a second LO generator comprising a second frequency doubler and a second frequency divider, the second frequency doubler configured to receive the VCO signal and generate a second signal fed into the second frequency divider, the second signal having the second frequency, configuring the TX to operate at a first LO frequency equal to the second frequency, and configuring the MRX to operate at a second LO frequency equal to the first frequency through disabling the second frequency doubler.

21 Claims, 16 Drawing Sheets

(56) References Cited

U.S. PATENT DOCUMENTS

| | | | |
|---|---|---|---|
| 10,003,415 B1 | 6/2018 | Jiang et al. | |
| 10,855,226 B1 * | 12/2020 | Han | H03D 7/1466 |
| 2010/0321245 A1 | 12/2010 | Aoki | |
| 2013/0257508 A1 | 10/2013 | Goel et al. | |
| 2014/0194076 A1 | 7/2014 | Hwang et al. | |
| 2015/0349755 A1 | 12/2015 | van Sinderen et al. | |
| 2016/0065195 A1 * | 3/2016 | Farazian | H03K 5/1506 327/238 |
| 2017/0302308 A1 | 10/2017 | Jiang et al. | |
| 2017/0359076 A1 * | 12/2017 | Rafi | H03L 7/0891 |
| 2018/0139078 A1 | 5/2018 | Ayush et al. | |
| 2018/0175945 A1 * | 6/2018 | Jiang | H03K 3/017 |
| 2022/0190848 A1 * | 6/2022 | Jiang | H04B 1/0096 |
| 2022/0294684 A1 * | 9/2022 | Jiang | H04B 1/0475 |

FOREIGN PATENT DOCUMENTS

| | | | | |
|---|---|---|---|---|
| WO | WO-2014109955 A1 * | 7/2014 | | H04B 1/0475 |
| WO | WO-2020149888 A1 * | 7/2020 | | H03D 7/163 |
| WO | WO-2021046421 A1 * | 3/2021 | | H04B 1/0475 |
| WO | WO-2021056001 A2 * | 3/2021 | | |
| WO | WO-2021091610 A1 * | 5/2021 | | H03D 7/165 |
| WO | WO-2021091616 A1 * | 5/2021 | | H03D 7/165 |
| WO | WO-2021091619 A1 * | 5/2021 | | H03D 7/165 |
| WO | WO-2021056001 A3 * | 9/2021 | | |

* cited by examiner

SPUR COMPENSATION METHOD AND SYSTEM

CROSS REFERENCE TO RELATED APPLICATIONS

This application is a continuation of Application No. PCT/US2020/049507, entitled "Spur Compensation Method and System," filed on Sep. 4, 2020, which claims priority to PCT Application International Application No. PCT/US2019/049792, entitled "Half-Carrier Frequency Spur Compensation," filed on Sep. 5, 2019, each application is hereby incorporated herein by reference.

TECHNICAL FIELD

The disclosure generally relates to compensating for a frequency spur in a radio transmitter and/or receiver, or more generally, a transceiver.

BACKGROUND

In a wireless communication system, a 3-phase transmitter (TX) of a transceiver (TRX) can be used for harmonics rejection while beneficially keeping a voltage controlled oscillator (VCO), which is used to generate a carrier frequency, running at a low frequency. Depending on the choice of VCO frequency, it is possible that an undesirable spur at substantially half of the carrier frequency may show up. For 4G and 5G wireless communication systems with inter-band carrier aggregation (CA) support, the undesirable spur at substantially half the carrier frequency, also referred to as the half clock spur, may land within the receiver frequency and de-sense the receiver (RX). Accordingly, it would be beneficial to reduce the half clock spur level so that the impact to the RX is reduced and preferably minimized.

In a 3-Phase receiver (RX) or 3-Phase measurement receiver (MRX) case, a blocker (i.e., interferer or spur) at substantially half that carrier frequency can be folded back into an in-band frequency and degrade the signal-to-noise ratio (SNR). Accordingly, it is also desirable to keep the folded energy as low as possible in order to improve the SNR.

SUMMARY

According to one aspect of the present disclosure, there is provided a transceiver (TRX) comprising a duty cycle controller, a frequency synthesizer, a transmitter (TX), a measurement receiver (MRX), and a power measurer. The duty cycle controller is configured to selectively output a duty cycle control code. The frequency synthesizer is configured receive the duty cycle control code, from the duty cycle controller, and output first, second, and third phase local oscillator (LO) signals having a same frequency and a same duty cycle. The frequency synthesizer uses the duty cycle control code to control the duty cycle of the first, second, and third phase LO signals. The TX is configured to convert digital. In-phase and Quadrature-phase signals (digital I and Q signals), to first, second, and third phase digital signals that are offset in phase, respectively. The TX is also configured to produce, based on the first, second, and third phase digital signals, and the first, second, and third phase LO signals, an analog TX output signal. The MRX is configured to receive the analog TX output signal produced by the TX or a coupled version thereof, receive a further LO signal having a frequency that is substantially half the frequency of the first, second, and third phase LO signals, and based thereon, output digital I and Q measurement signals. The power measurer is configured to receive the digital I and Q measurement signals from the MRX and output a power measurement indicative of power of the analog TX output signal at substantially half the frequency of the first, second, and third phase LO signals when the duty cycle control code is used by the frequency synthesizer to control the duty cycle of the first, second, and third phase LO signals.

Optionally, in any of the preceding aspects, the digital I and Q signals are offset in phase by 90 degrees from one another.

Optionally, in any of the preceding aspects, the second phase LO signal is offset in phase by 120 degrees from the first phase LO signal, and the third phase LO signal is offset in phase by 240 degrees from the first phase LO signal.

Optionally, in any of the preceding aspects, the first, second, and third phase digital signals, which the TX is configured to convert the digital I and Q signals to, are offset in phase, respectively, from the digital I signal by 0 degrees, 120 degrees, and 240 degrees.

Optionally, in any of the preceding aspects, the analog TX output signal, which the TX is configured to produce, is a frequency upconverted and analog version of the digital I and Q signals.

Optionally, in any of the preceding aspects, the digital I and Q measurement signals, which the MRX is configured to output, are indicative of signal content within the analog TX output signal at substantially half the frequency of the first, second, and third phase LO signals.

Optionally, in any of the preceding aspects, the duty cycle controller is configured to provide at least three different duty cycle control codes to the frequency synthesizer, and in response thereto, obtain for each of the at least three different duty cycle control codes a respective different power measurement which is indicative of the power of the analog TX output signal at substantially half the frequency of the first, second, and third phase LO signals when the duty cycle control code is used by the frequency synthesizer to control the duty cycle of the first, second, and third phase LO signals.

Optionally, in any of the preceding aspects, the duty cycle controller is configured to use polynomial regression during a calibration procedure to determine, based on the power measurements produced by the power measurer for the at least three different duty cycle control codes, an optimum duty cycle control code that provides for a minimum spur in the analog TX output signal at substantially half the frequency of the first, second, and third phase LO signals.

Optionally, in any of the preceding aspects, the duty cycle controller is configured to store the optimum duty cycle control code so it is available for use during normal operation of the TRX.

Optionally, in any of the preceding aspects, the minimum spur in the analog TX output signal, at substantially half the frequency of the first, second, and third phase LO signals, corresponds to when a voltage controlled oscillator (VCO) signal, which is used to produce the first, second, and third phase LO signals, is adjusted to have a 50% duty cycle.

Optionally, in any of the preceding aspects, each of the power measurements, that is produced by the power measurer for each duty cycle control code of the at least three different duty cycle control codes, is produced by determining a correlation between the digital I and Q measurement signals output by the MRX and digital I and Q calibration signals produced by a calibration source.

Optionally, in any of the preceding aspects, the frequency synthesizer, which produces the first, second, and third phase LO signals, comprises a first frequency synthesizer, and the TRX further comprises a second frequency synthesizer configured to produce the further LO signal that is provided to the MRX and that has the frequency that is substantially half the frequency of the first, second, and third phase LO signals produced by the first frequency synthesizer.

Optionally, in any of the preceding aspects, the TRX further comprises an IQ to 3-phase converter, first, second, and third digital-to-analog converters (DACs), a plurality of mixers, and a differential input amplifier. The IQ to 3-phase converter is configured to convert the digital I and Q signals to the first, second, and third phase digital signals. The first, second, and third DACs are configured to convert the first, second, and third phase digital signals, respectively, to first, second, and third differential pairs of analog signals. The plurality of mixers are configured to frequency up-convert the first, second, and third differential pairs of analog signals, or filtered versions thereof, using the first, second, and third phase LO signals. The differential input amplifier includes differential inputs at which the first, second, and third differential pairs of analog signals are combined into one differential pair of analog signals that is amplified by the differential input amplifier to produce the analog TX output signal that is the frequency upconverted and analog version of the digital I and Q signals.

Optionally, in any of the preceding aspects, the TRX further comprises a calibration source configured to produce a continuous wave (CW) tone signal having a frequency that is at least 100× less than the frequency of the first, second, and third phase LO signals produced by the frequency synthesizer, wherein the CW tone signal, produced by the calibration source, is used during a calibration procedure as the digital I and Q signals that are converted to the first, second, and third phase digital signals.

A further aspect of the present disclosure comprises a method for calibrating a transceiver (TRX). The method comprises providing a duty cycle control code, and producing first, second, and third phase local oscillator (LO) signals having a same frequency and a same duty cycle, wherein the duty cycle of the first, second, and third phase LO signals is controlled based on the duty cycle control code. The method further comprises converting digital. In-phase and Quadrature-phase signals (digital I and Q signals), to first, second, and third phase digital signals. The method also comprises producing, based on the first, second, and third phase digital signals, and the first, second, and third phase LO signals, an analog TX output signal that is a frequency upconverted and analog version of the digital I and Q signals. Additionally, the method includes producing based on the analog TX output signal or a coupled version thereof, digital I and Q measurement signals indicative of signal content within the analog TX output signal at substantially half the frequency of the first, second, and third phase LO signals. The method further includes producing, based on the digital I and Q measurement signals, a power measurement indicative of power of the analog TX output signal at substantially half the frequency of the first, second, and third phase LO signals when the duty cycle of the first, second, and third phase LO signals is controlled based on the duty cycle control code.

Optionally, in any of the preceding aspects, the method includes using at least three different duty cycle control codes to control the duty cycle of the first, second, and third LO signals, and for each duty cycle control code of the at least three different duty cycle control codes a respective different power measurement is produced which is indicative of the power of the analog TX output signal at substantially half the frequency of the first, second, and third phase LO signals when the duty cycle control code is used to control the duty cycle of the first, second, and third phase LO signals.

Optionally, in any of the preceding aspects, the method also includes using polynomial regression during a calibration procedure to determine, based on the power measurements produced for the at least three different duty cycle control codes, an optimum duty cycle control code that provides for a minimum spur in the analog TX output signal at substantially half the frequency of the first, second, and third phase LO signals.

Optionally, in any of the preceding aspects, the method includes storing the optimum duty cycle control code so it is available for use during normal operation of the TRX.

Optionally, in any of the preceding aspects, the minimum spur in the analog TX output signal, at substantially half the frequency of the first, second, and third phase LO signals, corresponds to when a voltage controlled oscillator (VCO) signal, which is used to produce the first, second, and third phase LO signals, is adjusted to have a 50% duty cycle.

Optionally, in any of the preceding aspects, each of the power measurements, that is produced for each duty cycle control code of the at least three different duty cycle control codes, is produced by determining a correlation between the digital I and Q measurement signals and digital I and Q calibration signals.

Optionally, in any of the preceding aspects, the method includes converting the first, second, and third phase digital signals, respectively, to first, second, and third differential pairs of analog signals. The method also includes frequency up-converting the first, second, and third differential pairs of analog signals, or filtered versions thereof, using the first, second, and third phase LO signals. The method further includes combining the frequency up-converted first, second, and third differential pairs of analog signals into one differential pair of analog signals that is amplified to produce the analog TX output signal that is the frequency up-converted and analog version of the digital I and Q signals.

A further aspect of the present disclosure comprises a transceiver (TRX) comprising a duty cycle controller, a frequency synthesizer, a receiver (RX), and a power measurer. The duty cycle controller is configured to selectively output a duty cycle control code. The frequency synthesizer is configured receive the duty cycle control code, from the duty cycle controller, and output first, second, and third phase local oscillator (LO) signals having a same frequency and a same duty cycle. The frequency synthesizer uses the duty cycle control code to control the duty cycle of the first, second, and third phase LO signals. The RX is configured to convert a received analog RX signal having a frequency that is substantially half the frequency of the first, second, and third phase LO signals, to first, second, and third phase digital signals having a baseband frequency. The RX is also configured to convert the first, second, and third phase digital signals to digital I and Q measurement signals. The power measurer is configured to receive the digital I and Q measurement signals from the RX and output a power measurement indicative of power of the digital I and Q measurement signals, received from the RX, at substantially half the frequency of the first, second, and third phase LO signals, when the duty cycle control code is used to control the duty cycle of the first, second, and third phase LO signals.

Optionally, in any of the preceding aspects, the second phase LO signal is offset in phase by 120 degrees from the first phase LO signal, and the third phase LO signal is offset in phase by 240 degrees from the first phase LO signal.

Optionally, in any of the preceding aspects, the second phase digital signal is offset by 120 degrees from the first phase digital signal, and the third phase digital signal is offset by 240 degrees from the first phase digital signal.

Optionally, in any of the preceding aspects, the duty cycle controller is configured to provide at least three different duty cycle control codes to the frequency synthesizer, and in response thereto, obtain for each of the at least three different duty cycle control codes a respective different power measurement indicative of the power of the digital I and Q measurement signals at substantially half the frequency of the LO signals when the duty cycle control code is used by the frequency synthesizer to control the duty cycle of the first, second, and third phase LO signals.

Optionally, in any of the preceding aspects, the duty cycle controller is configured to use polynomial regression during a calibration procedure to determine, based on the power measurements produced by the power measurer for the at least three different duty cycle control codes, an optimum duty cycle control code that provides for a minimum spur in the digital I and Q measurement signals at substantially half the frequency of the first, second, and third phase LO signals.

Optionally, in any of the preceding aspects, the duty cycle controller is configured to store the optimum duty cycle control code so that it is available during normal operation of the TRX.

Optionally, in any of the preceding aspects, the minimum spur in the digital I and Q measurement signal corresponds to when a voltage controlled oscillator (VCO) signal, which is used to produce the first, second, and third phase LO signals, is adjusted to having a 50% duty cycle.

Optionally, in any of the preceding aspects, each of the power measurements, that is produced for each duty cycle control code of the at least three different duty cycle control codes, is produced by determining a correlation between the digital I and Q measurement signals (produced by the RX when the duty cycle code is used) and digital I and Q calibration signals.

Optionally, in any of the preceding aspects, the RX of the TRX comprises an amplifier, a plurality of mixers, first, second, and third analog-to-digital converters (ADCs), and a 3-phase to IQ converter. The amplifier is configured to receive the analog RX signal and produce therefrom a corresponding amplified differential pair of analog signals. The plurality of mixers are configured to frequency down-convert the amplified differential pair of analog signals, using the first, second, and third phase LO signals output by the frequency synthesizer, to thereby produce first, second, and third differential pairs of frequency down-converted analog signals, wherein the second differential pair of frequency down-converted analog signals is offset in phase from the first differential pair of frequency down-converted analog signals by 120 degrees, and the third differential pair of frequency down-converted analog signals is offset in phase from the first differential pair of frequency down-converted analog signals by 240 degrees. The first, second, and third ADCs are configured to convert the first, second, and third differential pairs of frequency down-converted analog signals, or filtered versions thereof, to the first, second, and third phase digital signals having the baseband frequency. The 3-phase to IQ converter is configured to convert the firsts, second, and third phase digital signals to the digital I and Q signals that are offset in phase by 90 degrees from one another, and which are provided to the power measurer.

A further aspect of the present disclosure comprises a method for calibration a transceiver (TRX) including a receiver (RX). The method comprises providing a duty cycle control code, and producing first, second, and third phase local oscillator (LO) signals having a same frequency and a same duty cycle, wherein the duty cycle of the first, second, and third phase LO signals is controlled based on the duty cycle control code. The method also comprises receiving, at the RX of the TRX, an analog RX signal having a frequency that is substantially half the frequency of the first, second, and third phase LO signals. The method further comprises converting the received analog RX signal to first, second, and third phase digital signals having a baseband frequency. Additionally, the method includes converting the first, second, and third phase digital signals to digital I and Q measurement signals. Further, the method includes producing, based on the digital I and Q measurement signals, a power measurement indicative of power of the digital I and Q measurement signals at substantially half the frequency of the first, second, and third phase LO signals when the duty cycle control code is used to control the duty cycle of the first, second, and third phase LO signals.

Optionally, in any of the preceding aspects, at least three different duty cycle control codes are used to adjust the duty cycle of the first, second, and third LO signals, and for each duty cycle control code of the at least three different duty cycle control codes a respective different power measurement is produced which is indicative of the power of the digital I and Q measurement signals at substantially half the frequency of the first, second, and third phase LO signals when the duty cycle control code is used to control the duty cycle of the first, second, and third phase LO signals.

Optionally, in any of the preceding aspects, the method includes using polynomial regression during a calibration procedure to determine, based on the power measurements produced for the at least three different duty cycle control codes, an optimum duty cycle control code that provides for a minimum spur in the digital I and Q signals at substantially half the frequency of the first, second, and third phase LO signals.

Optionally, in any of the preceding aspects, the method also includes storing the optimum duty cycle control code so it is available for use during normal operation of the TRX.

Optionally, in any of the preceding aspects, the minimum spur in the digital I and Q corresponds to when a voltage controlled oscillator (VCO) signal, which is used to produce the first, second, and third phase LO signals, is adjusted to having a 50% duty cycle.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION OF ILLUSTRATIVE EMBODIMENTS

The present disclosure will now be described with reference to the figures, which in general relate to apparatuses and methods for compensating for a half-carrier frequency spur that can occur in a 3-phase TX and/or RX of a TRX, and more generally, in an M-phase TX and/or RX of a TRX where M is equal to 3 or is a multiple of 3 (e.g., M can be 3, 6, or 9). When M is greater than 3 (e.g., 6 or 9), a half-carrier frequency spur can occur when a voltage con- trolled oscillator (VCO) of the TX and/or RX runs at lower than the typical M/2*fLO frequency (e.g. ½*M/2*fLO) and the M/2*fLO clock is generated by doubling the VCO signal, i.e. (½*M/2*fLO)*2=M/2*fLO.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
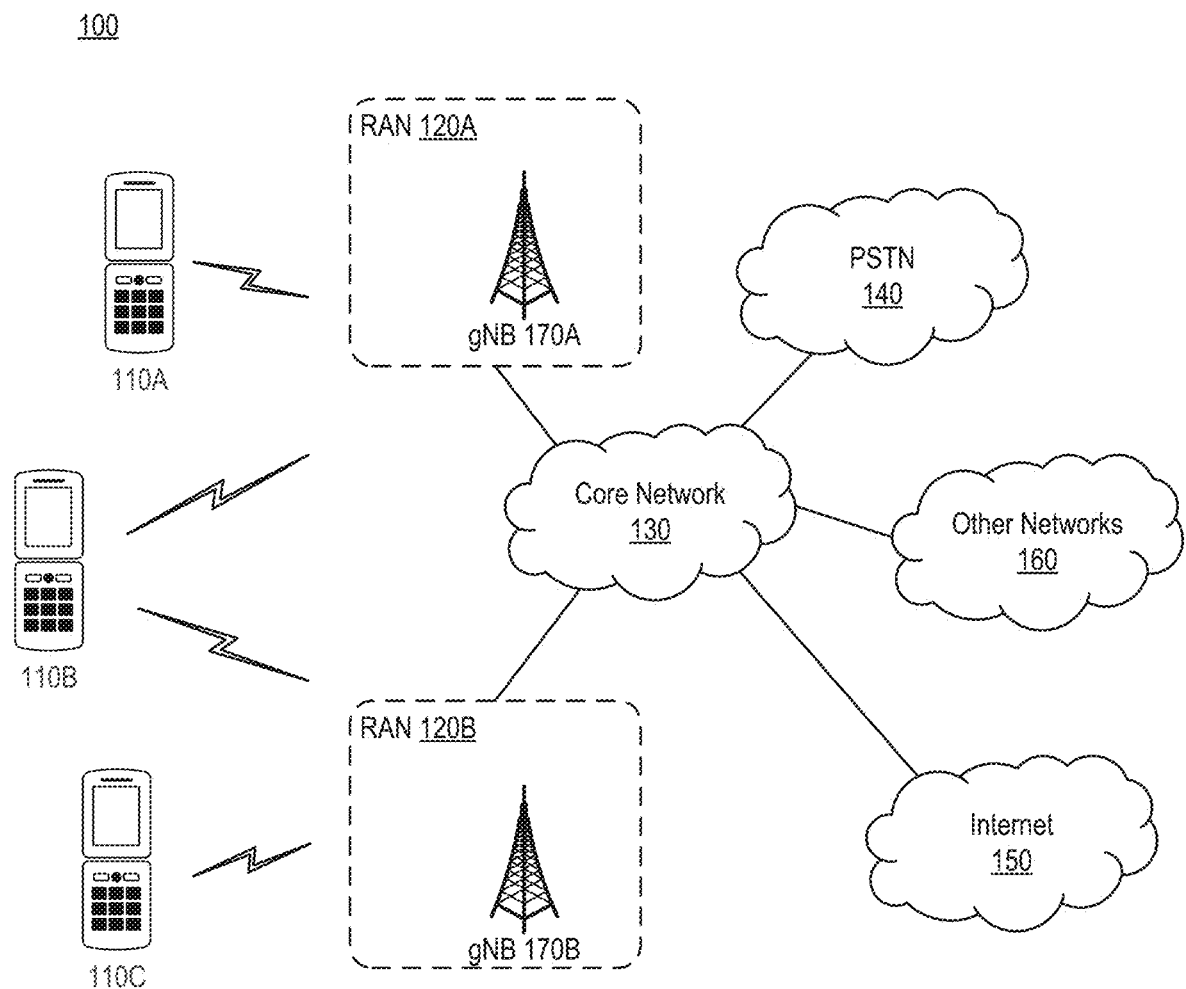
FIG. 1 illustrates an exemplary wireless network for communicating data.
Figure 2:
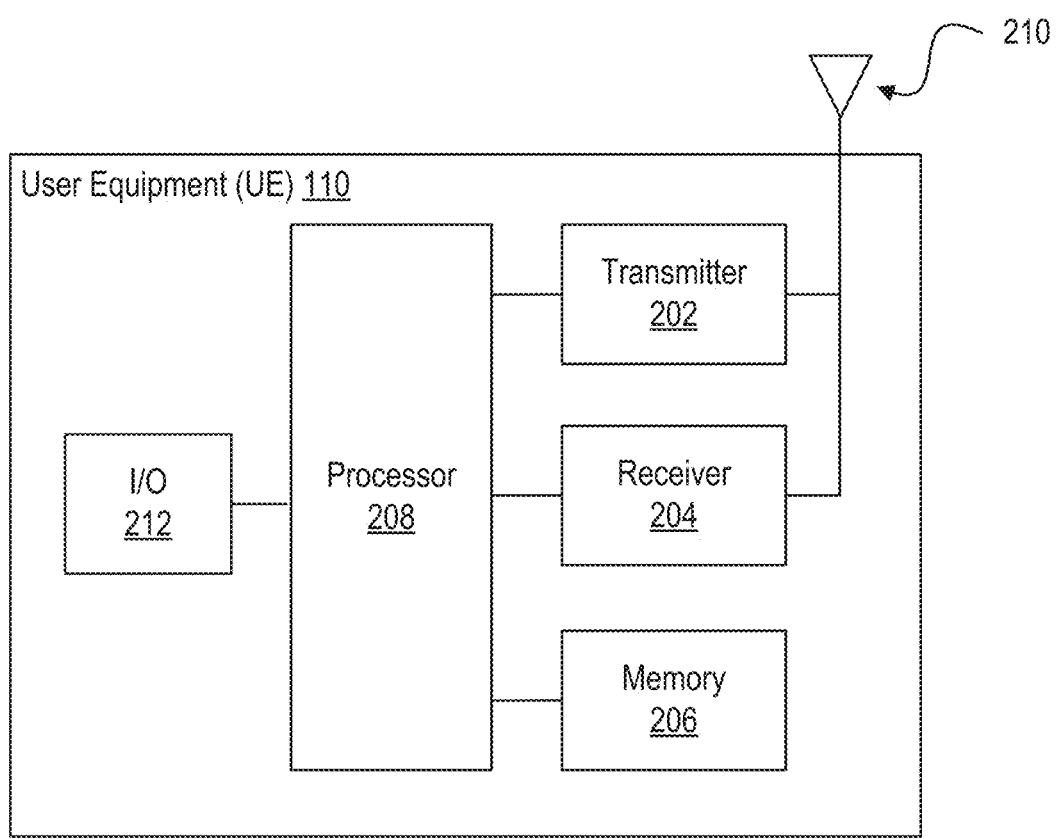
FIG. 2 illustrates example details of user equipment (UE) that may implement the methods and teachings according to this disclosure.
Figure 3:
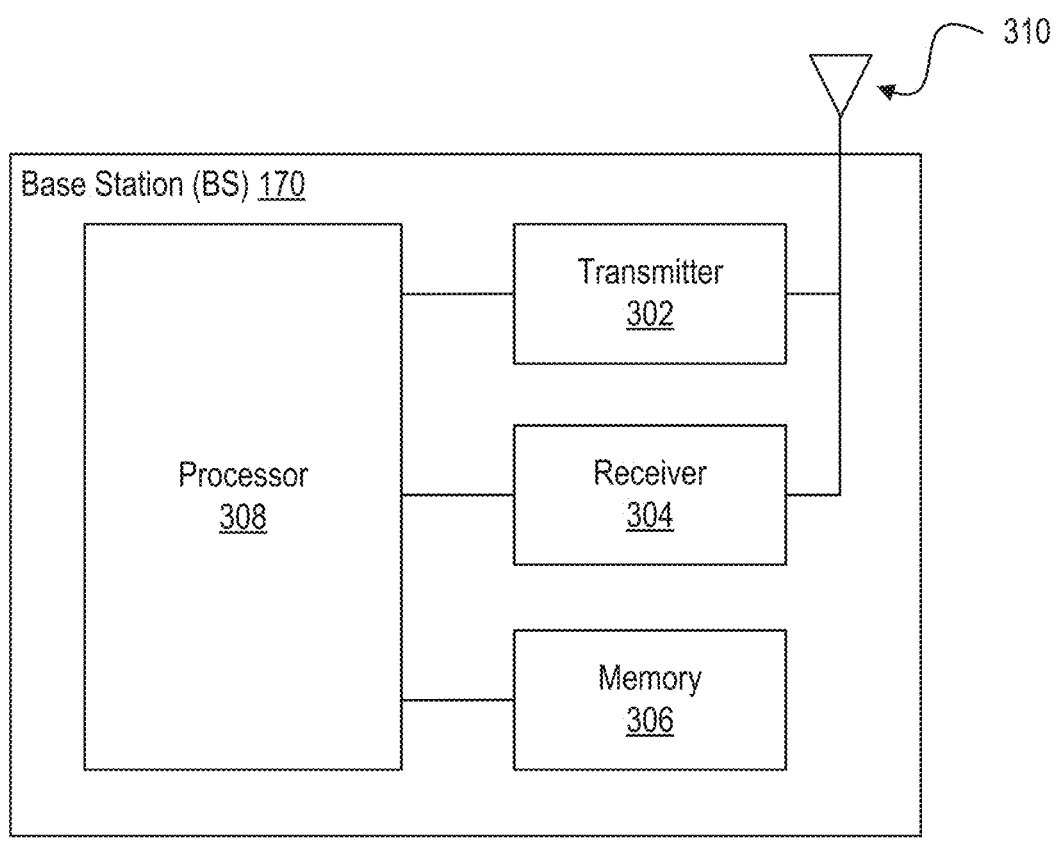
FIG. 3 illustrates an example base station (BS) that may implement the methods and teachings according to this disclosure.

Before provided additional details of embodiments of the present technology, FIG. 1 is used to describe an exemplary wireless network for communicating data, FIG. 2 is used to describe exemplary details of an instance of user equipment (UE) introduced in FIG. 1, and FIG. 3 is used to describe exemplary details of an instance of a base station (BS) introduced in FIG. 1. Referring to FIG. 1, illustrated therein is an exemplary wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g., 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (1-DMA), orthogonal FDMA (OFDMA), or single-carrier 1-DMA (SC-FDMA).

The user equipment (UE) 110A, 110B, and 110C, which can be referred to individually as a UE 110, or collectively as the UEs 110, are configured to operate and/or communicate in the system 100. For example, a UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

FIG. 2 illustrates example details of a UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit. The memory 206 is non-transitory memory storage, in one embodiment.

The transmitter (TX) 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver (RX) 204 can be configured to demodulate data or other content received by the at least one antenna 210. The receiver 204 can also be configured to amplify, filter and frequency convert RF signals received via the antenna 210. The receiver 204 is an RF signal receiver, in some embodiments. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters (TXs) 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 208 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit. The memory 306 is non-transitory memory storage, in one embodiment.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile and retrieval device(s).

Figure 4:
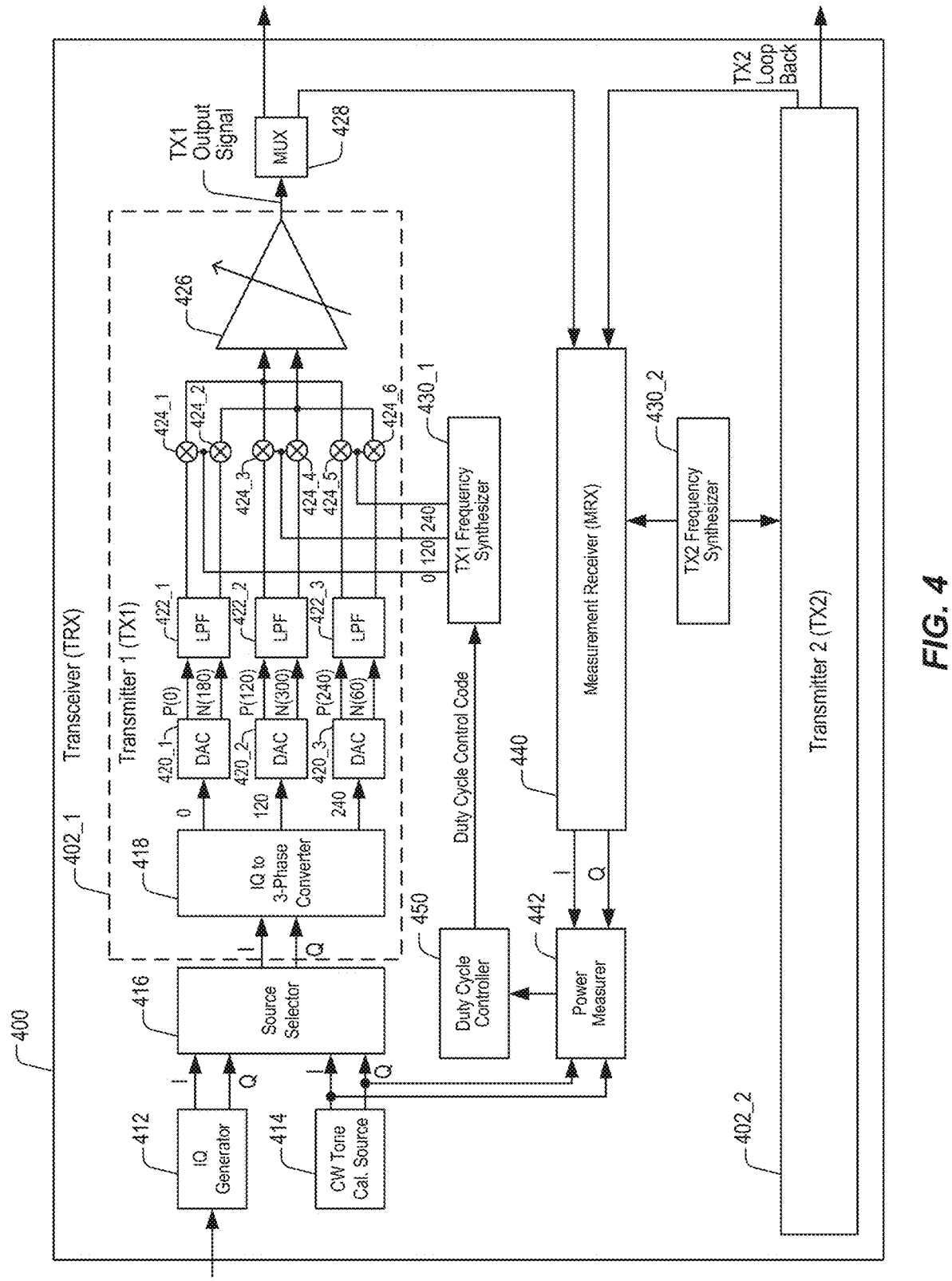
FIG. 4 illustrates a block diagram of one embodiment of a transceiver (TRX), which can be used in the UE of FIG. 2 or the BS of FIG. 3.

FIG. 4 illustrates a block diagram of one embodiment of a transceiver (TRX) 400, according to an embodiment of the present technology. The TRX 400 can, for example, be used in the UE of FIG. 2 or the BS of FIG. 3, but is not limited thereto. Referring to FIG. 4, the TRX 400 is shown as including a first transmitter (TX1) 402_1, a second transmitter (TX2) 402_2, an IQ generator 412, a continuous wave (CW) calibration source 414, a source selector 416, a measurement receiver (MRX) 440, a power measurer 442, a duty cycle controller 450, a first frequency synthesizer 430_1, and a second frequency synthesizer 430_2.

Still referring to FIG. 4, the TX1 402_1 is shown as including an IQ to 3-phase converter 418, digital-to-analog converters (DACs) 420_1, 420_2, and 420_3, low pass filters (LPFs) 422_1, 422_2, 422_3, mixers 424_1 to 424_6, a variable gain amplifier (VGA) 426. It is noted that certain components shown outside of the TX1 402_1 can alternatively be considered as being included within the TX1 402_1, such as the IQ generator 412, the CW tone calibration source 414, and the source selector, depending upon implementation. Downstream of the VGA 426 is a multiplexer (MUX) 428, which is shown as being outside of the TX1 402_1, but can alternatively be considered part of the TX1 402_1. The TX2 can include the same or similar components as the TX1, but can be used for transmitting at a different carrier frequency than the TX1. The second frequency synthesizer 430_2 (also referred to as the TX2 frequency synthesizer) can be used to provide one or more local oscillator (LO) signals to the TX2 402_2.

The TX1 frequency synthesizer 430_1 generates three versions of a carrier signal (e.g., a 5 GHz carrier signal), including 0-degree phase carrier signal, a 120-degree phase carrier signal that is offset from the 0-degree phase carrier signal by 120 degrees, and a 240-degree phase carrier signal that is offset from the 0-degree phase carrier signal by 240 degrees. These three phrase carrier signal that are output by the TX1 frequency synthesizer 430_1 can also be referred to as first, second, and third phase LO signals. The first, second, and third phase LO signals have a same frequency (e.g., 5 GHz) and a same duty cycle. The duty cycle of the first, second, and third phase LO signals is controlled by a duty cycle control signal that is provided to the TX1 frequency synthesizer 430_1 by the duty cycle controller 450, as will be described in further detail below. As noted above, an example of the frequency of the first, second, and third phase LO signals is 5 GHz. Assuming that a frequency of the LO signal(s) produced by the TX2 frequency synthesizer 430_2 is half the frequency of the LO signals produced by the TX1 frequency synthesizer 430_1, the MRX 440 can use an LO signal from the TX2 frequency synthesizer 430_2 to measure the spur at substantially half the carrier signal frequency of a TX1 loop back signal during calibration. This can be accomplished through correlation or some other technique. The frequency of the first, second, and third phase LO signals produced by the TX1 frequency synthesizer 430_1 can also be referred to as fLO. In accordance with certain embodiments, the measurement of the spur at substantially half the carrier signal frequency occurs at fLO/2–fBB, where fBB is the baseband frequency of the TX1 402_1.

During normal operation of the TRX 400, the IQ generator 412 receives a digital input signal and generates in-phase (I) and quadrature-phase (Q) versions thereof, which are also digital signals. In other words, the IQ generator 412 convert the digital input signal to digital In-phase and Quadrature-phase digital signals (digital I and Q signals) that are 90 degrees offset from one another. The digital input signal (that is provided to the IQ generator 412) can be a voice and/or data signal that after signal processing, frequency conversion, and amplification, is for transmission, e.g., via an antenna. The IQ generator can be, e.g., a baseband modem, but is not limited thereto. There are various well known ways in which the IQ generator 412 can be implemented, as would be known by one of ordinary skill in the art. Since the digital I and Q signals that are output by the IQ generator 412 are generated based on the digital input signal provided thereto, the digital I and Q signals that are output by the IQ generator 412 can be referred to more specifically as digital I and Q voice and/or data signals. The digital I and Q voice and/or data signals output by the IQ generator 412 are presumed to be at baseband.

The CW tone calibration source 414 generates digital I and Q signals that are used for calibration, and thus, these signals can be referred to more specifically as digital I and Q calibration signals. A frequency of the digital I and Q calibration signals output by the CW tone calibration source 414 can be, e.g., 1 MHz, and for much of the remaining discussion is presumed to be 1 MHz. Nevertheless, it is noted that the digital I and Q calibration signals can have alternative frequencies. In accordance with certain embodiments described herein, a frequency of the digital I and Q calibration signals is at least 100× less than that frequency of the LO signals (i.e., the carrier frequency) produced by the TX1 frequency synthesizer 430_a.

The source selector 416 receives the digital I and Q voice and/or data signals from the IQ generator 412, also receives the digital I and Q calibration signals from the CW tone calibration source 414, and based on a selection signal (e.g., from a controller, not shown), selects which of the digital I and Q signals are provided to the IQ to 3-phase converter 418. During normal operation of the TRX 400 the source selector 416 provides the digital I and Q voice and/or data signals to the IQ to 3-phase converter 418. However, during calibration operation of the TRX 400 (i.e., during a calibration procedure), the source selector 416 provides the digital I and Q calibration signals to the IQ to 3-phase converter 418. Such calibration can be a factory calibration that is only performed prior to shipment and sale of the TRX 400. Additionally, or alternatively, calibration can be performed from time to time after shipment and sale of the TRX 400.

The IQ to 3-phase converter 418 converts the digital I and Q signals provided thereto to three signals that are offset in phase from one another, including a 0-degree phase signal, a 120-degree phase signal, and a 240-degree phase signal. In accordance with certain embodiments, the 0-degree phase signal has the same phase as the I signal, the 120-degree phase signal is offset in phase from the 0-degree phase signal by 120 degrees, and the 240-degree phase signal is offset in phase from the 0-degree phase signal by 240 degrees. There are various different ways that an IQ to 3-phase converter could be implemented, as would be understood by one or ordinary skill in the art. An exemplary implementation of the IQ to 3-phase converter 418 is described below with reference to FIG. 12.

Still referring to FIG. 4, the 0-degree phase signal, the 120-degree phase signal, and the 240-degree phase signal, which are digital signals output by the IQ to 3-phase converter, are each provided to a respective one of the DACs 420_1, 420_2, and 420_3. The DACs 420_1, 420_2, and 420_3 can be referred to herein collectively as the DACs 420, or individually as a DAC 420. Each of the DACs 420 has a single-ended input and differential outputs at which are output differential analog signals that are 180 degrees offset from one another, one of which can be referred to as a positive (P) signal, and the other of which can be referred to as a negative (N) signal. More specifically, the DAC 420_1 receives the digital 0-degree phase signal and outputs an analog P(0) signal and an analog N(180) signal that is offset from the P(0) signal by 180 degrees; the DAC 420_2 receives the digital 120-degree phase signal and outputs an analog P(120) signal and an analog N(300) signal that is offset from the P(120) signal by 180 degrees; and the DAC 420_3 receives the digital 240-degree phase signal and outputs an analog P(140) signal and an analog N(60) signal that is offset from the P(140) signal by 180 degrees. The differential outputs of each of the DACs 420 are filtered by a respective one of the LPFs 422_1, 422_2, and 422_3, which can be referred to collectively as the LPFs 422, or individually as an LPF 422. The LPFs 422 filter out undesirable frequency components that results from the digital to analog conversions performed by the DACs 420.

The filtered signals output by the LPFs 422 are each provided to a respective one of the mixers 424_1, 424_2, 424_3, 424_4, 424_5, and 424_6, which can be referred to collectively as the mixers 424, or referred to individually as a mixer 424. Each of the mixers 424 also receives one of the first, second, and third phase LO signals from the TX1 frequency synthesizer 430_1, which each of the mixers 424 uses to upconvert the frequency of the filtered signals to an appropriate higher frequency that is within a desired frequency channel. For an example, the frequency of the carrier signals produced by the TX1 frequency synthesizer 430_1 can be 5 GHz.

The filtered P(0) signal and the 0-degree phase carrier signal are provided to the mixer 424_1, and the mixer 424_1 outputs a frequency upconverted version of the P(0) signal; and the filtered N(180) signal and the 0-degree phase carrier signal are provided to the mixer 424_2, and the mixer 424_2 outputs a frequency upconverted version of the N(180) signal. The filtered P(120) signal and the 120-degree phase carrier signal are provided to the mixer 424_3, and the mixer 424_3 outputs a frequency upconverted version of the P(120) signal; and the filtered N(300) signal and the 120-degree phase carrier signal are provided to the mixer 424_4, and the mixer 424_4 outputs a frequency upconverted version of the N(300) signal. The filtered P(240) signal and the 240-degree phase carrier signal are provided to the mixer 424_5, and the mixer 424_5 outputs a frequency upconverted version of the P(240) signal; and the filtered N(60) signal and the 240-degree phase carrier signal are provided to the mixer 424_6, and the mixer 424_6 outputs a frequency upconverted version of the N(60) signal. The aforementioned carrier signals can also be referred to as local oscillator (LO) signals, or more succinctly as LO signals, as noted above.

The VGA 426 is shown as including differential inputs and a single-ended output. The frequency upconverted versions of the P(0) signal, the P(120) signal, and the P(240) signal are summed at one of the differential inputs of the VGA 426; and the frequency upconverted versions of the N(180) signal, the N(300) signal, and the N(60) signal are summed at the other one of the differential inputs of the VGA 426. The output of the VGA 426, which is a frequency upconverted analog version of the digital voice and/or data signal provided to the IQ generator 412, or is a frequency upconverted analog version of the CW tone calibration signal produced by the CW tone calibration source 414, can be referred to as an analog TX output signal, which is an RF signal. The analog TX output signal is shown as being provided to the MUX 428. The MUX 428, based on a selection signal (e.g., from a controller, not shown), either provides the output of the VGA 426 for transmission (e.g., by an antenna) or provides the output of the VGA 426 as a TX1 loop back signal that is provided to the MRX 440. In place of the MUX 428 can be a coupler, e.g., the same or similar to the coupler 962 shown in FIG. 9 discussed below.

Still referring to FIG. 4, the MRX 440, which receives the analog TX output signal from the MUX 428 during a calibration process, also receives a further LO signal from the TX2 frequency synthesizer 430_2, wherein the further LO has a frequency that is half the frequency of the LO signals produced by the TX1 frequency synthesizer 430_1. Accordingly, if the frequency of the LO signal produced by the TX1 frequency synthesizer 430_1 is 5 GHz, then the frequency of the further LO signal produced by the TX2 frequency synthesizer would be 2.5 GHz. Assuming the carrier frequency generated by the TX1 frequency synthesizer is 5 GHz, and that the CW tone calibration source 414 produces 1 MHz digital I and Q calibration signals, then the analog TX output signal fed back to the MRX 440 will have a frequency of 5.001 GHz (i.e., 5 GHz+1 MHz=5.001 GHz). In such a case the MRX 440 output digital I and Q measurement signals would be indicative of signal content within the analog TX output signal at 2.499 GHz (i.e., 2.5

GHz−1 MHz=2.499 GHz). The MRX 440, for example, can include similar circuitry to that of the RX or MRX 1002, which is discussed below with reference to FIG. 10, but is not limited thereto. For example, the MRX 440 can includes mixers used for frequency down-conversions, low pass filters (LPFs) used for filtering, analog-to-digital converters (ADCs) used for analog to digital conversions, and a 3-phase to IQ converter that is used to convert first, second, and third digital phase signals to digital I and Q signals.

The digital I and Q measurement signals are provided by the MRX 440 to the power measurer 442, and the power measurer 442 outputs a power measurement indicative of power of the analog TX output signal at substantially half the frequency of the first, second, and third phase LO signals, and more specifically in this example, at 2.499 GHz. As shown in FIG. 4, the power measurer 442 also received the digital I and Q calibration signals from the CW tone calibration source 414. In accordance with certain embodiments, the power measurer 442 determines the power of the analog TX output signal (at substantially half the frequency of the first, second, and third phase LO signals) by determining a correlation between the digital I and Q measurement signals output by the MRX 440 and digital I and Q calibration signals produced by the CW calibration source 414.

The duty cycle controller 450, which can be implemented in software and/or firmware, provides duty cycle selection codes to the TX1 frequency synthesizer. For each different duty cycle selection code, the duty cycle controller 450 receives from the power measurer 442 a corresponding measurement of a magnitude of an undesirable spur (also referred to as a power measurement) at substantially half the carrier frequency (e.g., at 2.499 GHz) resulting from use of the duty cycle selection code. In certain embodiments, the duty cycle controller 450 can provide as few as three different duty cycle control codes (that are preferably spread out in code space) and obtain, from the power measurer 442, three corresponding power measurements of the half carrier frequency spurs occurring for the three codes. For an example, assuming there are thirty-one possible duty cycle control codes ranging from −15 to +15, the three codes provide to the TX1 frequency synthesizer 430_1 and for which measurements of the spur at substantially half the carrier frequency are made, can include the codes −8, +1, and +9, for example. Based on the three power measurements, the duty cycle controller 450 can perform a quadratic regression or some other type of polynomial regression to find an optimum or near optimum duty cycle control code that provides for a minimal spur at substantially half the carrier frequency (e.g., at 2.499 GHz). The term "substantially" as used herein means within +/−2% of a specified value. Accordingly, substantially 2.5 GHz means 2.5 GHz+/−2%, which is within the range of 2.45 GHz to 2.55 GHz.

Figure 5A:
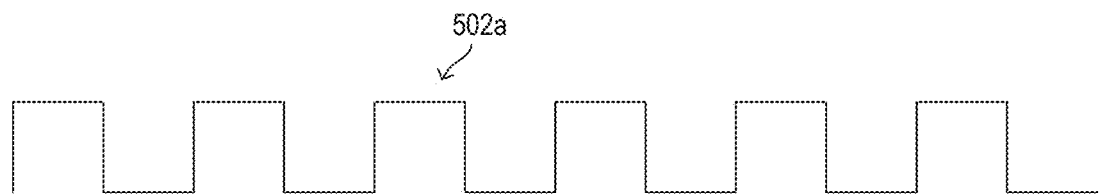
FIG. 5A illustrates an exemplary waveform of a VCO signal having a fifty-percent duty cycle.
Figure 5B:
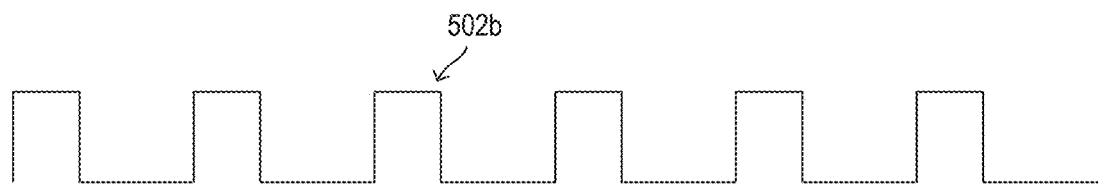
FIG. 5B illustrates an exemplary waveform of a VCO signal having non-fifty-percent duty cycle.

As will be discussed in further detail below, with reference to FIG. 11, the 0-degree phase carrier signal, the 120-degree phase carrier signal, and the 240-degree phase carrier signal (which can be referred to as first, second, and third LO signals) that are produced by the TX1 frequency synthesizer 430_1, can be produce using a voltage controlled oscillator (VCO) and a 3-phase generator that converts a VCO signal to the first, second, and third phase LO signals. FIG. 5A illustrates an exemplary waveform 502a of a VCO signal having a fifty-percent duty cycle. By contrast, FIG. 5B illustrates an exemplary waveform 502b of a VCO signal having non-fifty-percent duty cycle, e.g., a forty percent duty cycle. In accordance with certain embodiments of the present technology, the duty cycle controller 450 is used to determine a duty cycle control code that provides for a minimum spur in the analog TX output signal at substantially half of the frequency of the first, second, and third phase LO signals. In such embodiments, the minimum spur corresponds to when the VCO signal has a 50% duty cycle, at which point the first, second, and third LO signals will have a 33.3333% duty cycle.

Figure 6:
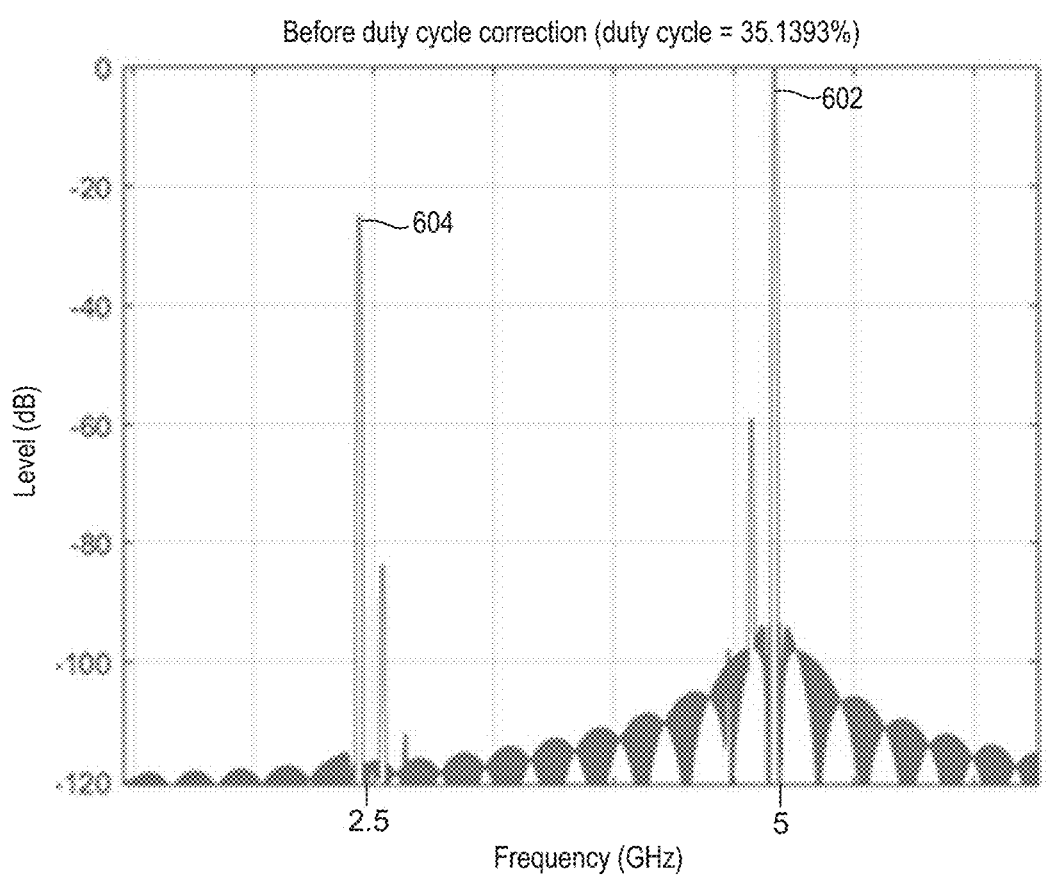
FIG. 6 is a graph that illustrates an undesirable spur occurring at substantially half a carrier frequency of a 3-phase TX.

FIG. 6 is an exemplary graph that illustrates an undesirable spur occurring at substantially half a carrier frequency of a 3-phase TX, such as the TX1 402_1. In this exemplary graph the duty cycle of the first, second, and third phase LO signals was 35.1393%. In FIG. 6, the peak labeled 602 corresponds to the desired TX output signal, and the peak labeled 604 corresponds to the unwanted half carrier frequency spur, which can also be referred to as an unwanted half clock spur.

Figure 7:
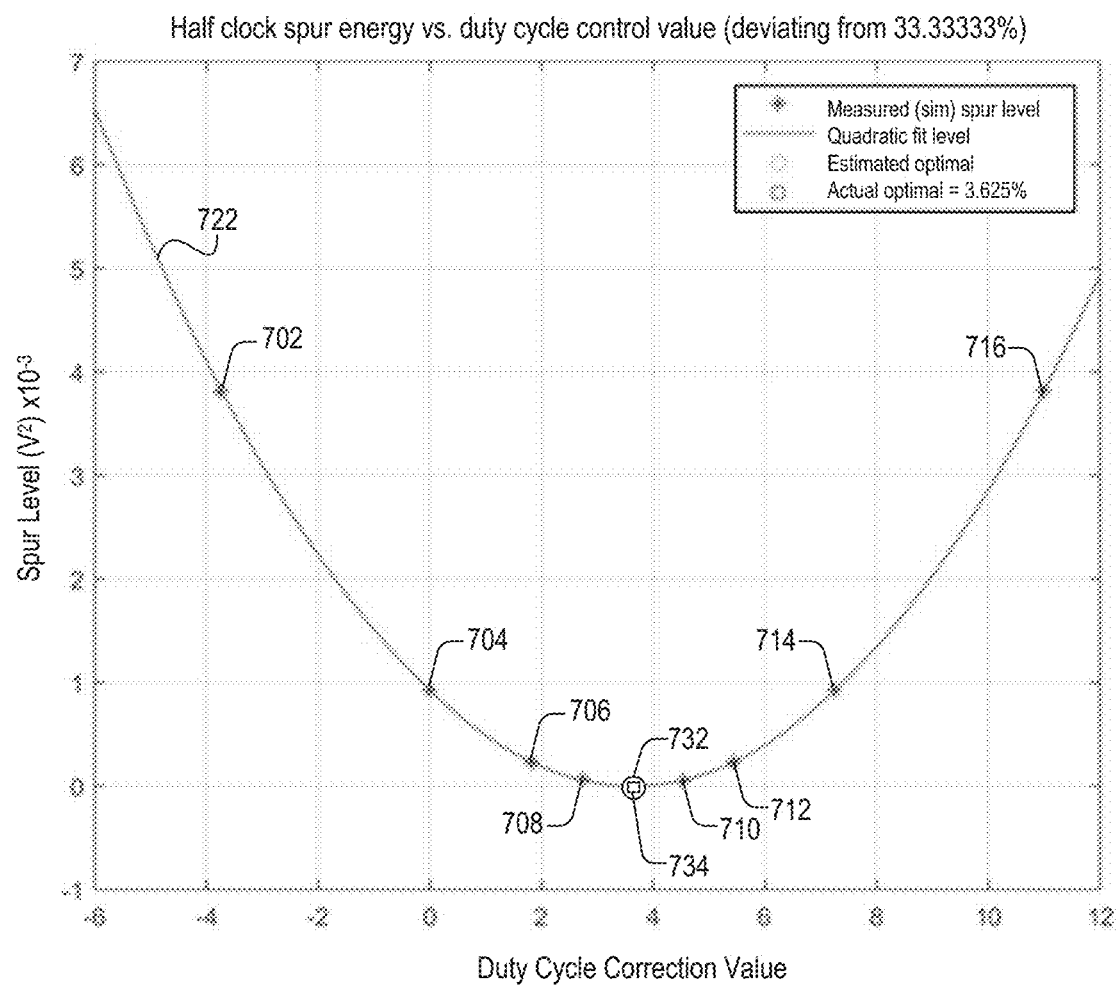
FIG. 7 is a graph that illustrates an energy level of an undesirable spur occurring at substantially half a carrier frequency versus duty cycle control code.

FIG. 7 is a graph that illustrates an energy level of an undesirable spur occurring at substantially half a carrier frequency versus duty cycle control value. Referring to FIG. 7, the asterisks (*) labeled 702, 704, 706, 708, 710, 712, 714, and 716 are simulated spur power level measurements, at substantially half the carrier frequency, for various different duty cycle control values. The difference between duty cycle control codes and duty cycle control values, is that the duty cycle control codes are limited to integer values, whereas the duty cycle control values (since they are being applied in simulations) at not limited to integer values. The line labeled 722 represents a best fit line determined using a quadratic equation of some other type of polynomial regression. The circle labeled 732 is an estimated optimum duty cycle control value. The square labeled 734 is an actual optimum duty cycle control value, which is almost exactly the same as the estimated optimum duty cycle control value. Presuming duty cycle control codes are limited to integer values, the closest duty cycle control code to the estimated and actual optimum duty cycle control values, for this example, is a duty cycle control code having the value "4". Thus, in this example, a duty cycle control code having the value "4" is the optimum duty cycle control code. Embodiments of the present technology, described herein, can be used to identify, during a calibration procedure, that the optimum duty cycle control code is one having the value "4".

Figure 8A:
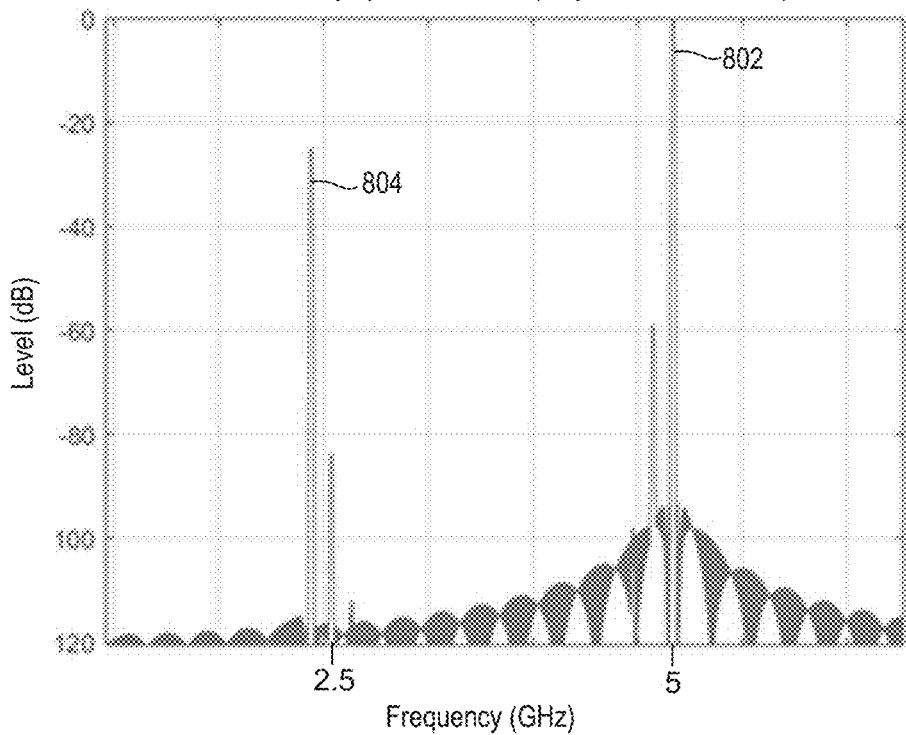
FIG. 8A is a graph that illustrates an undesirable spur occurring at substantially half a carrier frequency of a 3-phase TX.

FIG. 8A is an exemplary graph that illustrates an undesirable spur occurring at substantially half a carrier frequency of a 3-phase TX, such as the TX1 402_1. In this exemplary graph the duty cycle of the first, second, and third phase LO signals having the carrier frequency was 35.1393%. In FIG. 8A, the peak labeled 802 corresponds to the desired TX output signal, and the peak labeled 804 corresponds to the unwanted half carrier frequency spur, which can also be referred to as an unwanted half clock spur. FIG. 8A is the same as FIG. 6, but is repeated so that it is shown adjacent to the graph in FIG. 8B.

Figure 8B:
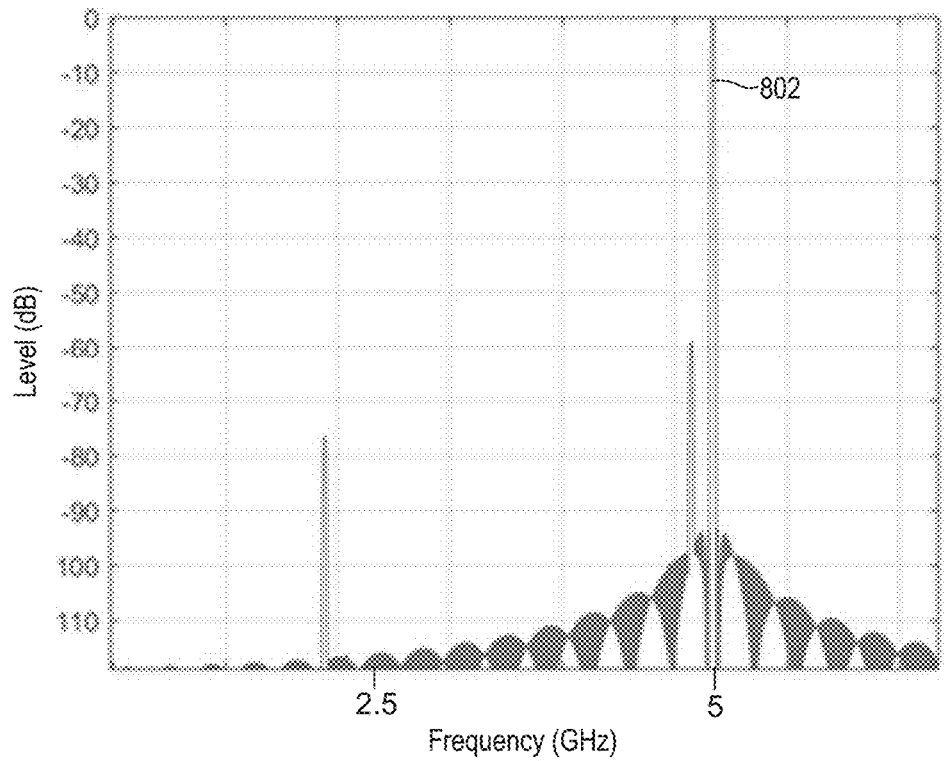
FIG. 8B is a graph that that illustrates how an embodiment of the present technology can reduce the undesirable spur occurring at substantially half a carrier frequency of a 3-phase TX using duty cycle correction.

FIG. 8B is a graph that that illustrates how an embodiment of the present technology can reduce the undesirable spur occurring at half a carrier frequency of a 3-phase TX using duty cycle correction, and more generally, duty cycle control. As can be appreciated from FIG. 8B, by using an embodiment of the present technology to adjust (and more generally, control) a duty cycle of the LO signals, produced by the TX1 frequency synthesizer 430_1, the undesirable spur (804 in FIG. 8A) that occurred at half the carrier frequency of the 3-phase TX is eliminated, without adversely affecting the peak labeled 802 that corresponds to the desired analog TX output signal.

Figure 9:
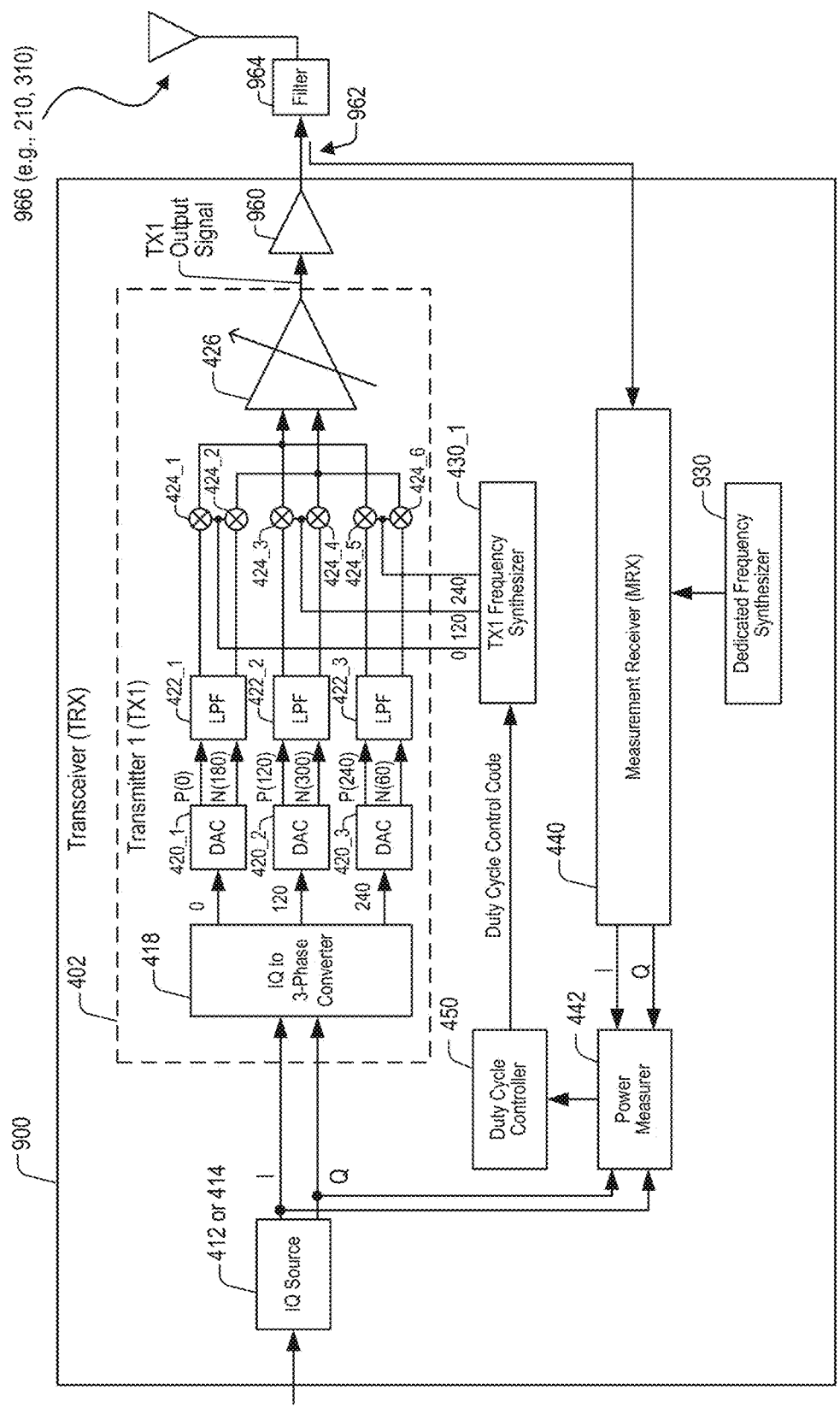
FIG. 9 illustrates a block diagram of another embodiment of a TRX, which can be used in the UE of FIG. 2 or the BS of FIG. 3.

FIG. 9 illustrates a block diagram of another embodiment of a transceiver (TRX) 900, which can be used in the UE of FIG. 2 or the BS of FIG. 3. The components in the TRX 900 shown in FIG. 9 that are the same as the components in the TRX 400 shown in FIG. 4, are labeled the same, and need not be described again. A comparison between FIGS. 9 and 4 shows that the TRX 900 does not include the TX2 402_2, and includes a dedicated frequency synthesizer 930 for use by the MRX 440, rather than including the TX2 frequency synthesizer 430_2 that was primarily for used by the TX2. Further, rather than including the multiplexer 428 to provide the TX1 loop back signal to the MRX 440, the TRX 900 includes a coupler 962. Further, the TRX 900 is shown as including a low noise amplifier (LNA) 960 and a filter 964 that is used to filter out noise cause by the LNA 960. Nevertheless, the operation of the TRX 900 during calibration and normal operation is essentially the same as the operation of the TRX 400 during calibration and normal operation. The embodiment described with reference to FIG. 9 can be used to calibrate the TRX 900 on-the-fly during normal operation thereof, not just during a calibration procedure.

Figure 10:
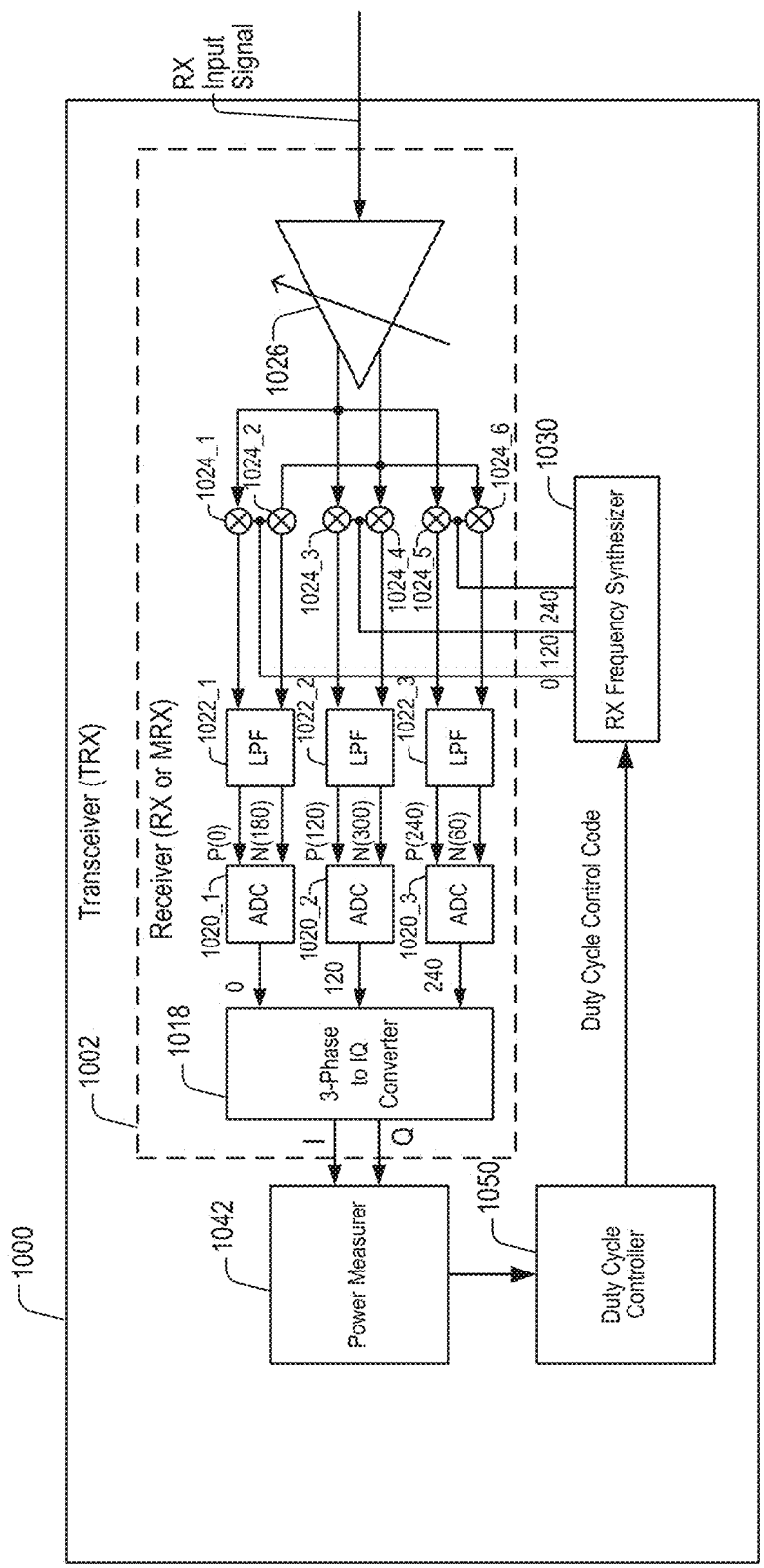
FIG. 10 illustrates a block diagram of a further embodiment of a TRX, which can be used in the UE of FIG. 2 or the BS of FIG. 3.

FIG. 10 illustrates a block diagram of a further embodiment of a transceiver (TRX) 1000, which can be used in the UE of FIG. 2 or the BS of FIG. 3. The TRX 1000 includes an RX 1002 (which can be an MRX), an RX frequency synthesizer 1030, a power measurer 1042, and a duty cycle controller 1050. The RX 1002 includes a VGA 1026, mixers 1024_1 through 1024_6, LPFs 1022_1, 1022_2, and 1022_3, analog-to-digital converters (ADCs) 1020_1, 1020_2, and 1020_3, and a 3-phase to IQ converter 1018. The VGA 1026, which can be a low noise amplifier (LNA), applies a gain to an analog RX signal provided to the input thereto to thereby amplify the signal. Such a signal can be a tone having a known frequency that is received directly from a calibration source during a calibration procedure. The analog RX signal provided to the VGA 1026 is an RF signal, e.g., having a frequency of 2.501 GHz. The VGA 1026 is shown as having a single input and differential outputs. The differential signals output by the VGA 1026, which can also be referred to as a differential pair of signals, are analog differential signals. One of the differential outputs of the VGA 1026, which can be referred to as the positive output, is provided to the mixers 1024_1, 1024_3, and 1024_5. The other one of the differential outputs of the VGA 1026, which can be referred to as the negative output, is provided to the mixers 1024_2, 1024_4, and 1024_6. The mixers 1024_1 through 1024_6 can be referred to collectively as the mixers 1024, or individually as a mixer 1024.

Each of the mixers 1024 also receives a carrier signal from the MRX frequency synthesizer 1030, which each of the mixers 1024 uses to down-convert the frequency of the filtered signals to a baseband frequency. For an example, the frequency of the carrier signals produced by the TX1 frequency synthesizer 430_1 can be 5 GHz. The TX1 frequency synthesizer 430_1 generates three versions of the carrier signal (e.g., a 5 GHz carrier signal), including 0-degree phase carrier signal, a 120-degree phase carrier signal that is offset from the 0-degree phase carrier signal by 120 degrees, and a 240-degree phase carrier signal that is offset from the 0-degree phase carrier signal by 240 degrees. These carrier signals can also be referred to as first, second, and third phase LO signals. The duty cycle of the first, second, and third phase LO signals is controlled by a duty cycle control signal that is provided to the RX frequency synthesizer 1030 by the duty cycle controller 1050.

The mixers 1024_1 and 1024_2 output a first differential pair of down-converted analog signals that are filtered by the LPF 1022_1, and then converted to a 0-degree phase digital signal by the ADC 1020_1. The mixers 1024_3 and 1024_4 output a second differential pair of down-converted analog signals that are filtered by the LPF 1022_2, and then converted to a 120-degree phase digital signal by the ADC 1020_2, wherein the 120-degree phase digital signal is offset by 120 degrees from the 0-degree phase digital signal. The mixers 1024_5 and 1024_6 output a third differential pair of down-converted analog signals that are filtered by the LPF 1022_3, and then converted to a 240-degree phase digital signal by the ADC 1020_3, wherein the 240-degree phase digital signal is offset by 240 degrees from the 0-degree phase digital signal. The 0-degree phase digital signal, the 120-degree phase digital signal, and the 240-degree phase digital signal, which can be referred to collectively as the three phase digital signals, are converted to digital I and Q measurement signals by the 3-phase to IQ converter 1018, which performs the reverse function of the IQ to 3-phase converter 418 discussed above with reference to FIG. 4, and below with reference to FIG. 12.

The digital I and Q measurement signals (output by the 3-phase to IQ converter 1018) are provided to the power measurer 1042. The power measurer 1042 outputs a power measurement indicative of power of the digital I and Q measurement signals, received from the RX 1002, at substantially half the frequency of the first, second, and third phase LO signals. The power measurement produced by the power measurer 1042 is provided to the duty cycle controller 1050, thereby enabling the duty cycle controller to known the power of the undesirable half clock spur that occurs when a specific duty cycle correction code is used to control the duty cycle of the first, second, and third phase LO signals.

In certain embodiments, the duty cycle controller 1050 provides at least three different duty cycle control codes to the frequency synthesizer 1030, and in response thereto, obtains for each of the at least three different duty cycle control codes a respective different power measurement (from the power measurer 1042) indicative of the power of the digital I and Q measurements signals (provided by the RX 1002 to the power measurer 1042) at substantially half the frequency of the LO signals when the duty cycle control code is used by the frequency synthesizer 1030 to control the duty cycle of the first, second, and third phase LO signals. In certain embodiments, each of the power measurements produced by the power measurer 1042, for each duty cycle control code of the at least three different duty cycle control codes, is produced by determining a correlation between the digital I and Q measurement signals produced by the RX when the duty cycle code is used and digital I and Q calibration signals (which correspond to the RX input signal).

In certain embodiments, the duty cycle controller 1050 uses polynomial regression during a calibration procedure to determine, based on the power measurements produced by the power measurer 1042 for the at least three different duty cycle control codes, a duty cycle control code that provides for a minimum spur in the digital I and Q measurement signals at substantially half the frequency of the first, second, and third phase LO signals. In certain embodiments, the minimum spur in the in the digital I and Q measurement signal corresponds to when a voltage controlled oscillator (VCO) signal, which is used to produce the first, second, and third phase LO signals, is adjusted to having a 50% duty cycle. When the duty cycle of the VCO signal is as close to 50% as practical, the duty cycle of the first, second, and third phase LO signals, output from the frequency synthesizer, will be as close as practical to 33.3333%.

Figure 11:
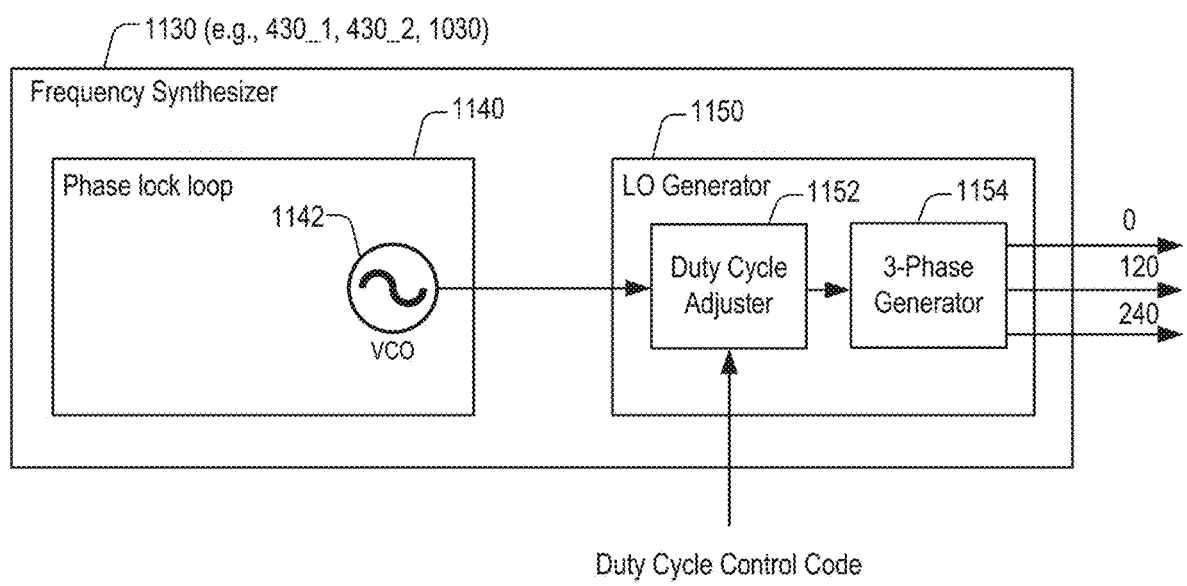
FIG. 11 is a block diagram that provides details of a frequency synthesizer, according to an embodiment of the present technology, which frequency synthesizer can be used in the TRXs of FIGS. 4, 9, and 10.

FIG. 11 is a block diagram that provides details of a frequency synthesizer 1130, according to an embodiment of the present technology, which frequency synthesizer can be used in the transceivers of FIGS. 4, 9, and 10. In other words, the frequency synthesizer 1130 in FIG. 11 can be used to implement the frequency synthesizer 430_1 in FIGS. 4 and 9, the frequency synthesizer 430_2 in FIG. 4, and/or the frequency synthesizer 1030 in FIG. 10. Referring to FIG. 11, the frequency synthesizer 1130 is shown as including a voltage controlled oscillator (VCO) 1142, which can be part of a phase lock loop (PLL) 1140. The VCO 1142 produces a VCO signal, e.g., a 5 GHz VCO signal. While the duty cycle of the VCO signal produced by the VCO 1142 is preferably exactly 50%, that will often not be the case. The VCO signal produced by the VCO 1142 is shown as being provided to a local oscillator (LO) generator 1150, which is shown as including a duty cycle adjuster 1152 and a 3-phase generator 1154. The duty cycle adjuster 1152 adjusts (i.e., increases or decreases) the duty cycle of the VCO signal provided to the duty cycle adjuster 1152 (by the VCO 1142) based on a duty cycle control code provided to the duty cycle adjuster 1152 by a duty cycle controller, e.g., the duty cycle controller 450 in FIG. 4 or 9, or the duty cycle controller 1050 in FIG. 10. In other words, a duty cycle controller adjusts the duty cycle of the VCO signal that is used to produce the first, second, and third phase LO signals. Accordingly, it can be said that the duty cycle control codes (provided by a duty cycle controller to a frequency synthesizer) are used to control the duty cycle of the first, second, and third phase LO signals output by the frequency synthesizer. In accordance with certain embodiments, the duty cycle adjuster 1152 is used to cause the duty cycle of the adjusted VCO signal (output from the duty cycle adjuster 1152) to be 50%, or as close as practical to 50%. The 3-phase generator 1154 generates, based on the adjusted VCO signal output by the duty cycle adjuster 1152, the first, second, and third phase LO signals having the same frequency (e.g., 5 GHz) and a same duty cycle, which signals can also be referred to as the 0-degree phase carrier signal, the 120-degree phase carrier signal that is offset from the 0-degree phase carrier signal by 120 degrees, and the 240-degree phase carrier signal that is offset from the 0-degree phase carrier signal by 240 degrees. When the duty cycle of the VCO signal is as close to 50% as practical, the duty cycle of the first, second, and third phase LO signals, output from the frequency synthesizer, will be as close as practical to 33.3333%.

Figure 12:
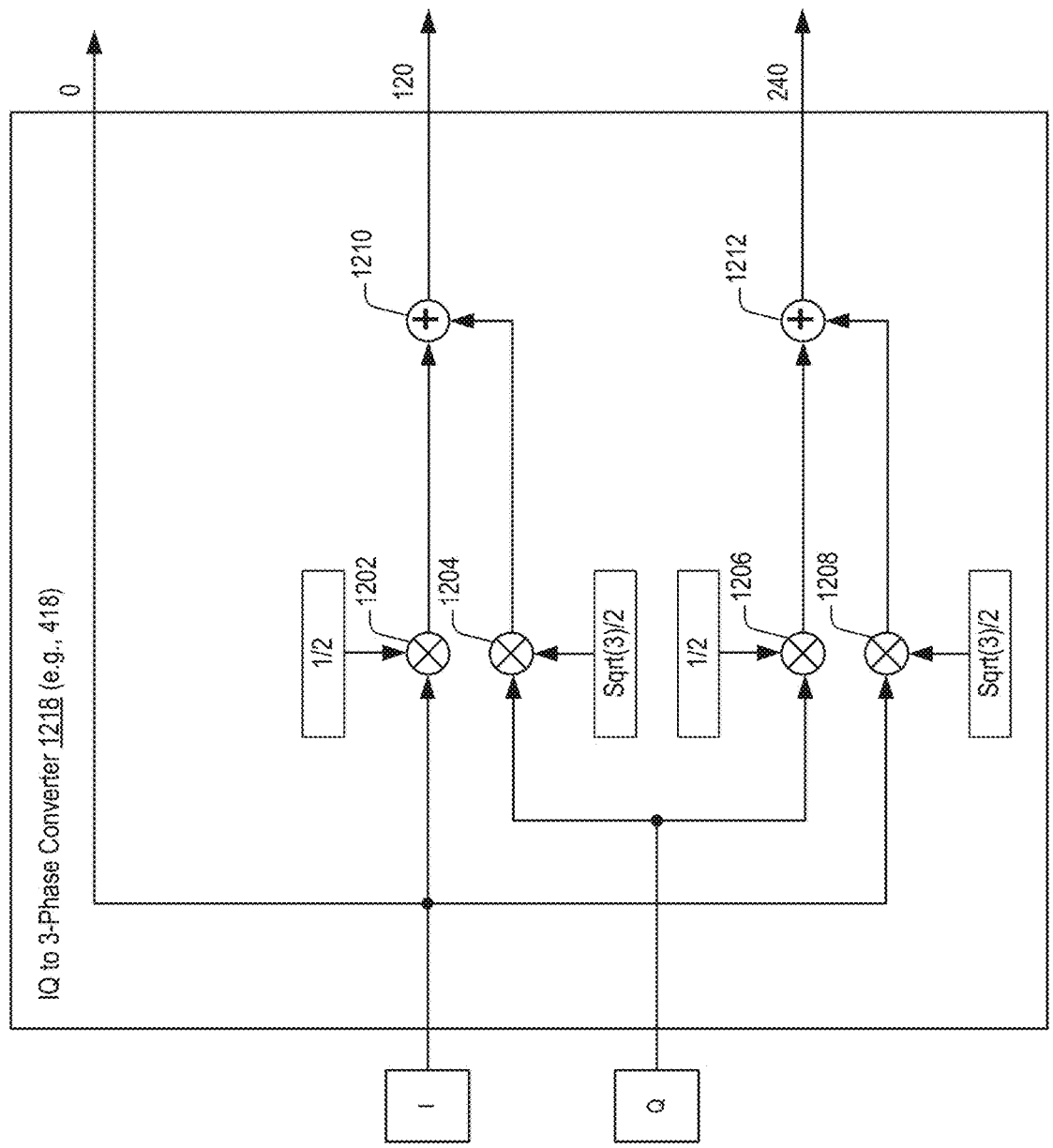
FIG. 12 is a block diagram that provides details of an IQ to 3-phase converter, according to an embodiment of the present technology, which IQ to 3-phase converter can be used in the TRXs of FIGS. 4, 9, and 10.

FIG. 12 is a block diagram that provides details of an exemplary IQ to 3-phase converter 1218, according to an embodiment of the present technology, which IQ to 3-phase converter can be used in the transceivers of FIGS. 4 and 9. More specifically, the IQ to 3-phase converter 1218 can be used to implement the IQ to 3-phase converter 418 in FIGS. 4 and 9. A converter having a reverse function can be used to implement the 3-phase to IQ converter 1018 in FIG. 10. Referring to FIG. 12, the IQ to 3-phase converter 418 is shown as including mixers 1202, 1204, 1206, and 1208, and summers 1210 and 1212. The digital I signal is shown as being used to provide the 0-degree phase output. The digital I signal is also shown as being provided to the mixer 1202, which weights that digital I signal by multiplying it by ½. The digital I signal is additionally shown as being provided to the mixer 1208, where it is weighted by the square-root of 3, divided by 2. The digital Q signal is shown as being provided to the mixer 1204, where it is weighted by the square-root of 3, divided by 2. The digital Q signal is also shown as being provided to the mixer 1202 where it is weighted by ½. The outputs of the mixers 1202 and 1204 are added, by the summer 1210, to produce the 120-degree phase output. The outputs of the mixers 1206 and 1208 are added, by the summer 1212, to produce the 240-degree phase output. Other techniques for providing an IQ to 3-phase converter are also possible, and within the scope of the embodiments described herein.

Figure 13:
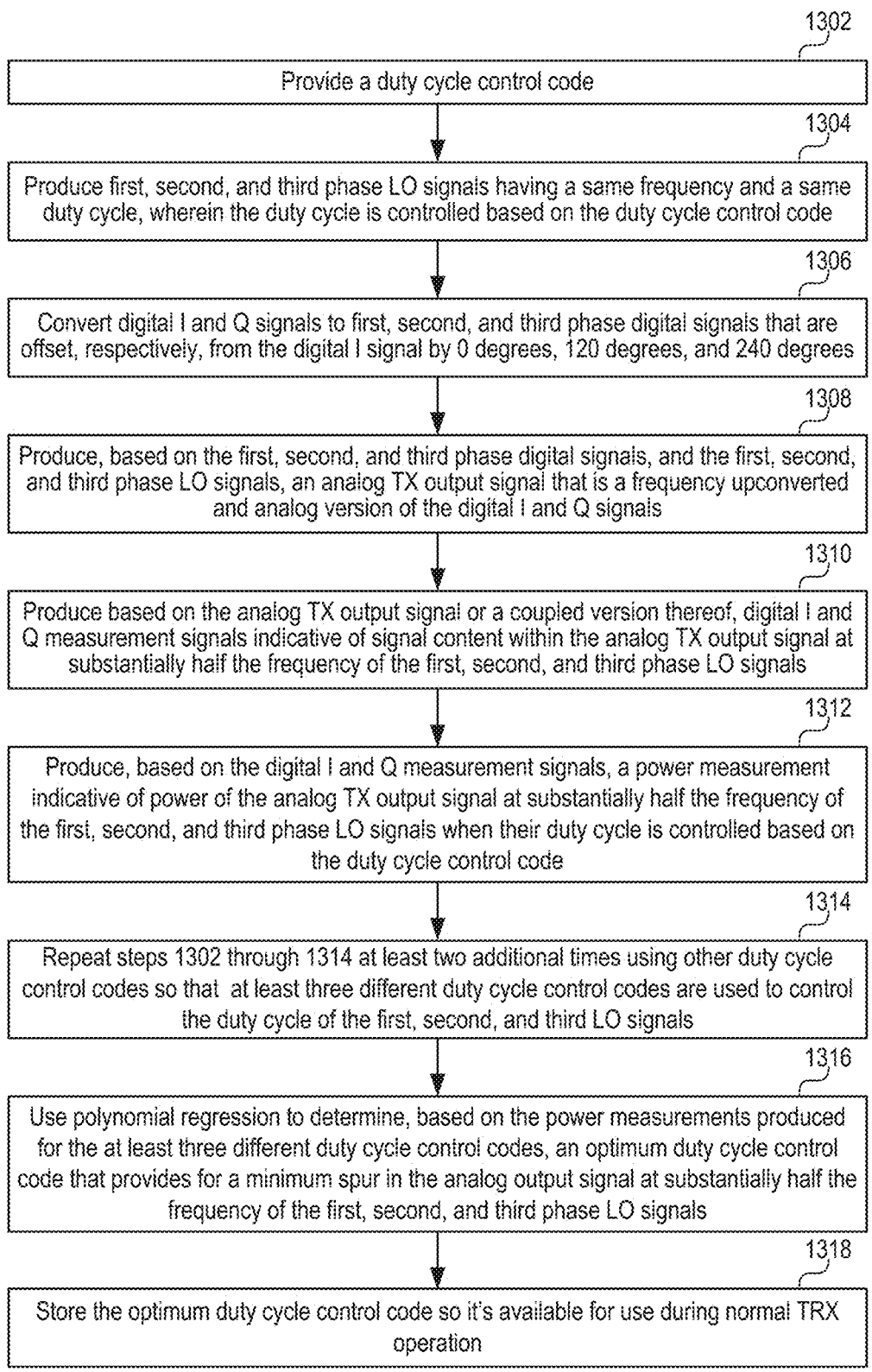
FIG. 13 is a flow diagram that provides details of methods for calibrating a TRX, in accordance with certain embodiments of the present technology.

The flow diagram in FIG. 13 will now be used to provides details of certain methods for calibrating a transceiver (TRX), such as the TRX 402_1 described above with reference to FIG. 4, or the TRX 402 described above with reference to FIG. 9, but not limited thereto.

Referring to FIG. 13, step 1302 involves providing (e.g., outputting) a duty cycle control code. In accordance with certain embodiments, each duty cycle control code is an integer value within a specified range. Depending on the specific implementation, the extent of the range and the granularity of the duty cycle control codes within the range may vary. In one example, discussed above, there are thirty-one possible duty cycle control codes ranging from −15 to +15. Other variations are also possible and within the scope of the embodiments described herein. Step 1302 can be performed, e.g., by the duty cycle controller 450 described above, initially with reference to FIG. 4.

Still referring to FIG. 13, step 1304 involves producing first, second, and third phase local oscillator (LO) signals having a same frequency and a same duty cycle, wherein the second phase LO signal is offset by 120 degrees from the first phase LO signal, and the third phase LO signal is offset by 240 degrees from the first phase LO signal, wherein the duty cycle of the first, second, and third phase LO signals is controlled based on the duty cycle control code. Step 1304 can be performed, e.g., by the TX1 frequency synthesizer 430_1 described above, initially with reference to FIG. 4, with exemplary details thereof described above with reference to FIG. 11.

Step 1306 involves converting digital In-phase and Quadrature-phase signals (digital I and Q signals), that are offset in phase by 90 degrees from one another, to first, second, and third phase digital signals that are offset, respectively, from the digital I signal by 0 degrees, 120 degrees, and 240 degrees. Step 1306 can be performed, e.g., by the IQ to 3-phase converter 418 described above, initially with reference to FIG. 4, with exemplary details thereof described above with reference to FIG. 12.

Step 1308 involves producing, based on the first, second, and third phase digital signals, and the first, second, and third phase LO signals, an analog TX output signal that is a frequency upconverted and analog version of the digital I and Q signals. Step 1308 can be performed, e.g., using the DACs 420, the LPFs 422, the mixers 424, and the VGA 426 described above with reference to FIG. 4. More specifically, the analog TX output signal produced at step 1308 can be the output of the VGA 426.

Step 1310 involves producing based on the analog TX output signal or a coupled version thereof, digital I and Q measurement signals indicative of signal content within the analog TX output signal at substantially half the frequency of the first, second, and third phase LO signals. Step 1310 can be performed, e.g., by the MRX 440 in FIG. 4 or FIG. 9. The analog TX output signal can be provided to the MRX 440 using the MUX 428 in FIG. 4, or a coupled version of the analog TX output signal can be provided to the MRX 440 using the coupler 962 in FIG. 9. Other variations are also possible and within the scope of the embodiments described herein.

Step 1312 involves producing, based on the digital I and Q measurement signals, a power measurement indicative of power of the analog TX output signal at substantially half the frequency of the first, second, and third phase LO signals when the duty cycle of the first, second, and third phase LO signals is controlled based on the duty cycle control code. Step 1312 can be performed, e.g., by the power measurer 442 in FIG. 4 or FIG. 9. In accordance with certain embodiments, each of the power measurements produce at step 1312, which is produced for each duty cycle control code of the at least three different duty cycle control codes, is produced by determining a correlation between the digital I and Q measurement signals (produced at step 1310) and digital I and Q calibration signals, e.g., provided by a calibration source, such as the calibration source 414.

As indicated at step 1314, steps 1302 through 1312 are repeated at least two additional times using other duty cycle control codes, such that at least three different duty cycle control codes are used to control the duty cycle of the first, second, and third LO signals. For each duty cycle control code (of the at least three different duty cycle control codes) a respective different power measurement is produced (e.g., by the power measurer 442), wherein each power measurement (corresponding to a duty cycle control code) is indicative of the power of the analog TX output signal at substantially half the frequency of the first, second, and third phase LO signals when the duty cycle control code is used to control the duty cycle of the first, second, and third phase LO signals.

Step 1316 involves using polynomial regression during a calibration procedure to determine, based on the power measurements produced for the at least three different duty cycle control codes, an optimum duty cycle control code that provides for a minimum spur in the analog output signal at substantially half the frequency of the first, second, and third phase LO signals. Step 1318 involves storing the optimum duty cycle control code so it is available for use during normal operation of the TRX. Steps 1316 and 1318 can be performed, e.g., by the duty cycle controller 450. The optimum duty cycle control code can be stored, e.g., in the memory 206 of the UE 110 described above with reference to FIG. 2, or in the memory 306 of the BS 170 described above in with reference to FIG. FIG. 3, or in memory or one or more registers of the TRX itself, but is not limited thereto.

The minimum spur in the analog TX output signal, at substantially half the frequency of the first, second, and third phase LO signals, corresponds to when a voltage controlled oscillator (VCO) signal, which is used to produce the first, second, and third phase LO signals, is adjusted to have a 50% duty cycle. Assuming the frequency synthesizer produces a three phase LO signals, i.e., first, second, and third phase LO signals, when the VCO signal has a 50% duty cycle, the three phase LO signals will have a 33.333% duty cycle.

Figure 14:
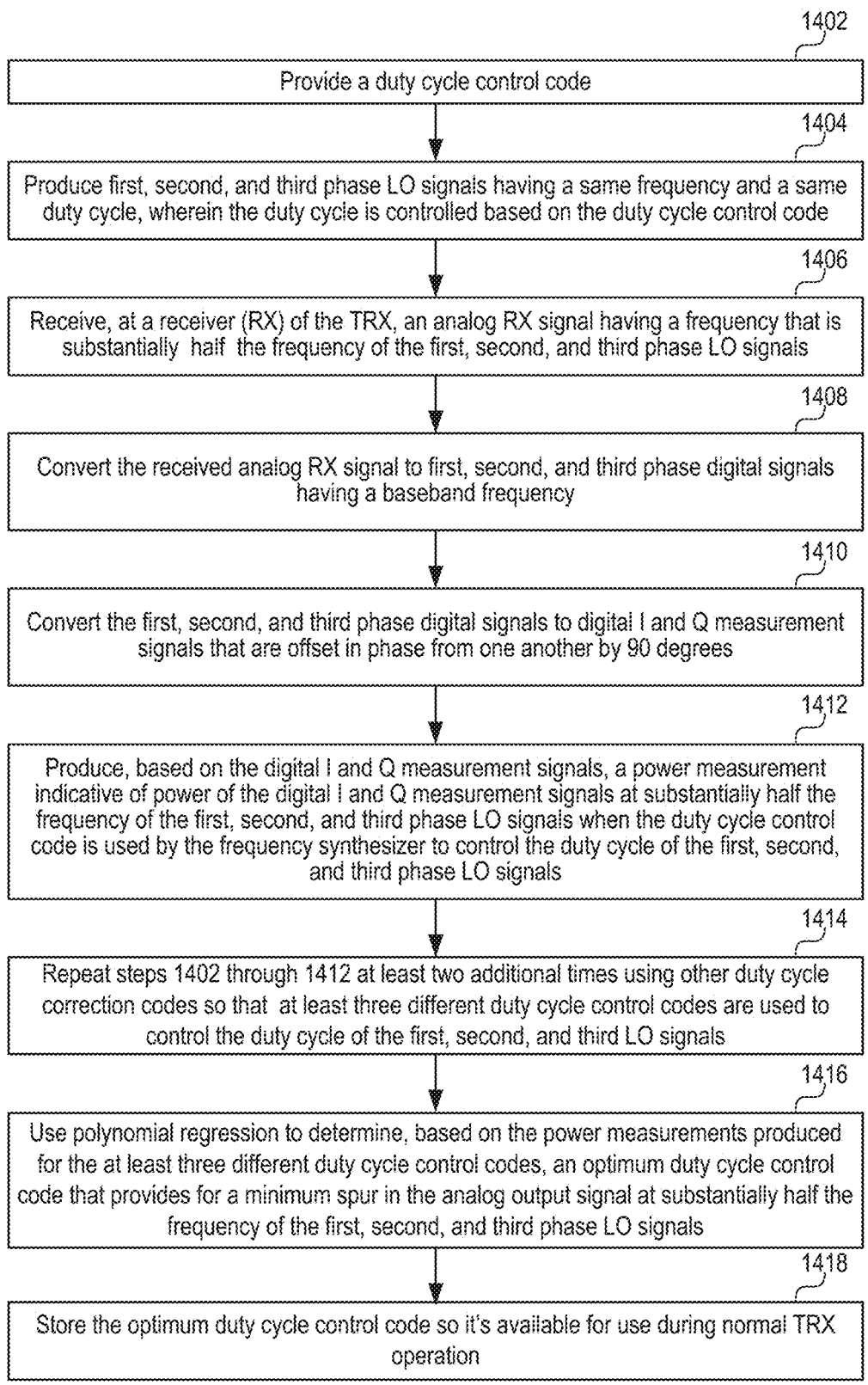
FIG. 14 is a flow diagram that provides details of methods for calibrating a TRX, in accordance with other embodiments of the present technology.

The flow diagram in FIG. 14 will now be used to provides details of certain methods for calibrating a transceiver (TRX), such as the TRX 1002 described above with reference to FIG. 9, but not limited thereto.

Referring to FIG. 14, step 1402 involves providing (e.g., outputting) a duty cycle control code. Step 1402 is the same as step 1302 described above with reference to FIG. 13, and thus, need not be described again. Step 1402 can be performed, e.g., by the duty cycle controller 1050 described above with reference to FIG. 10, but is not limited thereto.

Step 1404 involves producing first, second, and third phase local oscillator (LO) signals having a same frequency, wherein the second phase LO signal is offset in phase by 120 degrees from the first phase LO signal, and the third phase LO signal is offset in phase by 240 degrees from the first phase LO signal, when the duty cycle control code is used to control the duty cycle of the first, second, and third phase LO signals. Step 1404 is the same as step 1304 described above with reference to FIG. 13, and thus, need not be described again Step 1304 can be performed, e.g., by the RX frequency synthesizer 1030 described above, initially with reference to FIG. 10, with exemplary details thereof described above with reference to FIG. 11.

Step 1406 involves receiving, at a receiver (RX) of the TRX, an analog RX signal having a frequency that is substantially half the frequency of the first, second, and third phase LO signals. Step 1406 can be performed, e.g., by the RX 1002 described above with reference to FIG. 10, which can be an MRX, but is not limited thereto. The analog RX signal received at step 1406 can be produced, e.g., by a calibration source and can have a known frequency, e.g., 2.501 GHz.

Step 1408 involves converting the received analog RX signal to first, second, and third phase digital signals having a baseband frequency, wherein the second phase digital signal is offset by 120 degrees from the first phase digital signal, and the third phase digital signal is offset by 240 degrees from the first phase digital signal. Step 1408 can be performed, e.g., by the VGA 1026, the mixers 1024, the LPFs 1022, and the ADCs 1020 of the RX 1002 described above with reference to FIG. 10.

Step 1410 involves converting the first, second, and third phase digital signals to digital I and Q measurement signals that are offset in phase from one another by 90 degrees. Step 1410 can be performed, e.g., by the 3-phase to IQ converter 1018 described above with reference to FIG. 10.

Step 1412 involves producing, based on the digital I and Q measurement signals, a power measurement indicative of power of the digital I and Q measurement signals at substantially half the frequency of the first, second, and third phase LO signals when the duty cycle control code is used by the frequency synthesizer to control the duty cycle of the first, second, and third phase LO signals. Step 1412 can be performed, e.g., by the power measurer 1042 described above with reference to FIG. 10.

As indicated at step 1414, steps 1402 through 1412 are repeated at least two additional times using other duty cycle control codes, such that at least three different duty cycle control codes are used to control the duty cycle of the first, second, and third LO signals. For each duty cycle control code (of the at least three different duty cycle control codes) a respective different power measurement is produced (e.g., by the power measurer 1042) at an instance of step 1412, wherein each power measurement (corresponding to a duty cycle control code) is indicative of the power of the digital I and Q measurement signals at substantially half the frequency of the first, second, and third phase LO signals when the duty cycle control code is used to control the duty cycle of the first, second, and third phase LO signals.

Step 1416 involves using polynomial regression during a calibration procedure to determine, based on the power measurements produced for the at least three different duty cycle control codes, an optimum duty cycle control code that provides for a minimum spur in the digital I and Q signals at substantially half the frequency of the first, second, and third phase LO signals. Step 1418 involves storing the optimum duty cycle control code so it is available for use during normal operation of the TRX. Steps 1416 and 1418 can be performed, e.g., by the duty cycle controller 1050. The optimum duty cycle control code can be stored, e.g., in the memory 206 of the UE 110 described above with reference to FIG. 2, or in the memory 306 of the BS 170 described above in with reference to FIG. FIG. 3, or in memory or one or more registers of the TRX itself, but is not limited thereto.

The minimum spur in the in the digital I and Q corresponds to when a voltage controlled oscillator (VCO) signal, which is used to produce the first, second, and third phase LO signals, is adjusted to having a 50% duty cycle. Assuming a frequency synthesizer produces a three phase LO signals, i.e., first, second, and third phase LO signals, when the VCO signal has a 50% duty cycle, the three phase LO signals will have a 33.333% duty cycle.

In today's wireless (e.g., cellular) communications system, a three phase transmitter (TX) can be used for harmonics rejection while keeping VCO running at relatively low frequency compared to greater than three phase TXs, e.g., four phase or higher phase TXs. Depending on the choice of VCO frequency, it is possible that an undesirable spur at substantially half of the carrier frequency may show up, as noted above. For 4G/5G system with inter-band carrier aggregation (CA) support, the half clock spur may land within the receiver frequency and de-sense the receiver (RX). Embodiments of the present technology described herein can be used to reduce the half clock spur level so that the impact to an RX, and more generally a TRX, is minimized.

In a 3-Phase RX or MRX case, a blocker at substantially half the carrier frequency can be folded back into in-band and degrade the signal-to-noise ratio (SNR). Embodiments of the present technology can be used to keep the folded energy as low as possible in order to improve the SNR.

For TX calibration, embodiments of the present technology can directly measure the spur through an MRX while running a second TX frequency synthesizer at the victim receiver frequency. Algorithms described herein can make good prediction of the correction signal based on as few as three measurements so that the calibration time can be minimized.

For an RX, which can be an MRX, a blocker at half of the target frequency can be injected to MRX and using a method similar to one used with a TX, the folded energy from a half clock spur can be minimized.

This unwanted half clock spur may create issue in LTE/NR inter-band CA scenario. For example, if a first transmitter (TX1) is running at 5.3 GHz, a spur around 2.65 GHz can show up. Depending on CA cases, if a receiver (RX) for the same handset (worst case) also performs operation for Band 7 (RX frequency 2.62 GHz to 2.69 GHz), significant RX de-sense may occur. The source of the issue is the non-perfect duty cycle of a VCO signal produced by a voltage controller oscillator (VCO). Certain embodiments of the present technology provide a calibration technique to measure and adjust the duty cycle of the VCO signal in order to minimized the unwanted half clock spur.

Conventionally, 3-phase TRXs used a VCO clock frequency of fVCO=3*fLO, which caused high power consumption and increased VCO design difficulty. Embodiments of the present technology described herein allows the VCO to run at 1.5*fLO rate, which reduces the power consumption and lowers the VCO design difficulty.

The technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special-purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Figure 15:
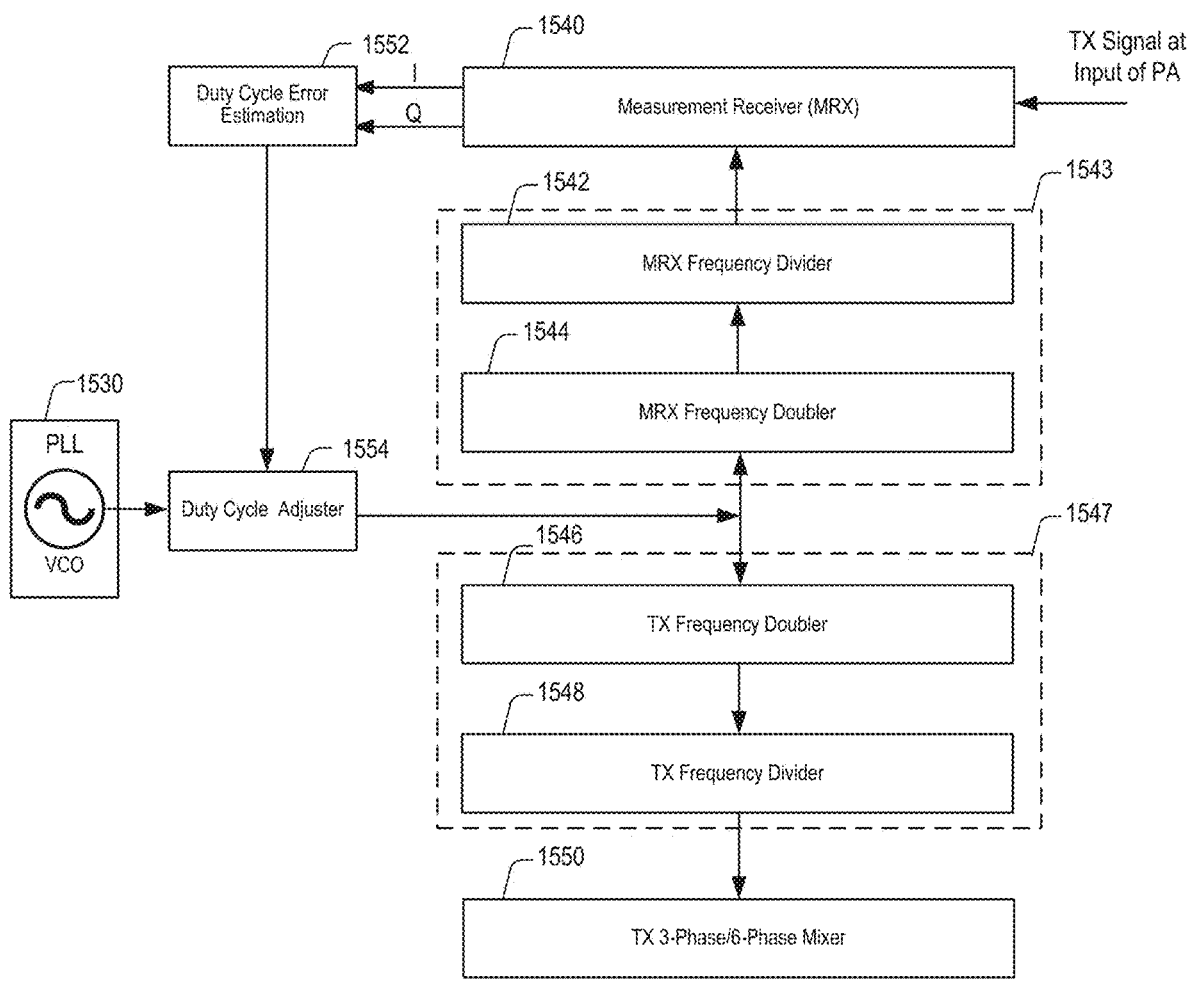
FIG. 15 illustrates an embodiment for reducing the half clock spur in accordance with various embodiments of the present disclosure.

FIG. 15 illustrates an embodiment for reducing the half clock spur in accordance with various embodiments of the present disclosure. A transceiver (TRX) comprises a transmitter and a receiver as shown in FIG. 4. For simplicity, only the relevant portions of FIG. 4 are illustrated in FIG. 15.

A first local oscillator (LO) generator 1547 comprises a first frequency doubler 1546 and a first frequency divider 1548. The first frequency doubler 1546 is a TX frequency doubler. The first frequency divider 1548 is a TX 3-phase/6-phase selector. As shown in FIG. 15, the first frequency doubler 1546 is configured to receive a voltage controlled oscillator (VCO) signal generated by a voltage controlled oscillator in a phase lock loop (PLL) 1530. The VCO signal is applied to the first frequency doubler 1546 through a duty cycle adjuster 1554. The PLL 1530 and the duty cycle adjuster 1554 are similar to the PLL and duty cycle adjuster shown in FIG. 11, and hence are not discussed in detail herein.

The first frequency doubler 1546 is configured to receive the VCO signal through the duty cycle adjuster 1554. The VCO signal has a first frequency. In some embodiments, the first frequency is about 7.5 GHz. The first frequency doubler 1546 is configured to generate a first signal fed into the first frequency divider 1548. The first signal has a second frequency that is twice the first frequency. In other word, the second frequency is about 15 GHz. The first frequency divider 1548 is configured to generate a plurality of TX LO signals fed into a mixer 1550. The mixer 1550 is a TX 3-phase/6-phase mixer. The mixer 1550 is similar to the mixers 424_1 to 424_6 shown in FIG. 4, and hence is not discussed in detail herein.

A second LO generator 1543 comprises a second frequency doubler 1544 and a second frequency divider 1542. The second frequency doubler 1544 is an MRX frequency doubler. The second frequency divider 1542 is an MRX 3-phase/6-phase selector. As shown in FIG. 15, the second frequency doubler 1544 is configured to receive the VCO signal generated by the voltage controlled oscillator in the PLL 1530. The VCO signal is applied to the second frequency doubler 1544 through the duty cycle adjuster 1554.

The second frequency doubler 1544 is configured to generate a second signal fed into the second frequency divider 1542. The second signal has the second frequency that is twice the first frequency. The second frequency divider 1542 is configured to generate a plurality of MRX LO signals fed into a receiver 1540. The receiver 1540 is a measurement receiver (MRX). Throughout the description, the receiver 1540 may be alternatively referred to as an MRX 1540. The MRX 1540 is similar to the measurement receiver 440 shown in FIG. 4, and hence is not discussed in detail herein.

As shown in FIG. 15, the MRX 1540 is configured to receive an analog TX output signal and generate measurement signals including distortion signals such as a half clock spur. The analog TX output signal is tapped from an input of a power amplifier (PA) of the transceiver (e.g., amplifier 960 shown in FIG. 9). The analog TX output signal is sampled at the input of the PA because this sampling point can avoid any significantly filtering of the half clock spur through the power amplifier and other post PA blocks, thus making the distortion measurement easier.

The MRX 1540 is employed to measure the half clock spur level, which is used to determine the duty cycle error of the VCO signal. In particular, the MRX 1540 is configured to generate digital I and Q measurement signals as shown in FIG. 15. The digital I and Q measurement signals are fed into a duty cycle error estimation unit 1552. The duty cycle error estimation unit 1552 is able to determine the correct duty cycle of the VCO signal through analyzing the half clock spur level in the digital I and Q measurement signals. The duty cycle error estimation unit 1552 generates a suitable duty cycle adjustment code based on a corresponding measurement of a magnitude of the half clock spur. The duty cycle adjustment code is fed into the duty cycle adjuster 1554 in which the duty cycle of the VCO signal has been adjusted, thereby reducing the half clock spur.

In operation, both the first frequency doubler 1546 and the second frequency doubler 1544 can be disabled. After any one of the doublers has been disabled, the VCO signal bypasses the disabled doubler and reaches the corresponding LO generator directly.

In operation, depending on design needs, by applying a control signal, the frequency dividers 1542 and 1548 can configure the respective LO generators to operate either in a 3-phase mode or in a 6-phase mode. When a 3-phase mode is selected, the corresponding LO generator generates three LO signals offset by 120 degrees from each other. Each LO signal of the three LO signals is of a duty cycle of about 33.3%. When a 6-phase mode is selected, the corresponding LO generator generates six LO signals offset by 60 degrees from each other. Each LO signal of the six LO signals is of a duty cycle of about 16.7%.

The TRX is configured to operate in a normal mode. In a first implementation of the normal mode, the TX is configured to operate in a 6-phase mode. The MRX is configured to operate in the 6-phase mode. The TX and the MRX are configured to operate at a same LO frequency.

For reducing the half clock spur, the TRX is configured to operate in a calibration mode. In a first implementation of the calibration mode, the TX is configured to operate in the 6-phase mode with a first LO frequency. The MRX is configured to operate in the 6-phase mode with a second LO frequency. The second LO frequency is equal to one half of the first LO frequency. The reduced LO frequency can be realized through disabling the second frequency doubler 1544.

The first implementation of the normal mode and the calibration mode can be summarized by the following table:

| PATH/MODE | FREQUENCY DOUBLER | 6PHASE/3PHASE SELECT | LO FREQUENCY |
|---|---|---|---|
| TX | ENABLE | 6-PHASE | FLO_TX |
| MRX NORMAL MODE | ENABLE | 6-PHASE | FLO_MRX = FLO_TX |
| MRX HALF CLOCK SPUR CALIBRATION | DISABLE | 6-PHASE | FLO_MRX = FLO_TX/2 |

One advantageous feature of having the system configuration shown in the table above is that the reduced LO frequency helps to make the detection of the half clock spur easier. In a conventional calibration mode, the MRX may operate with a same LO frequency (e.g., FLO_TX) as the TX. However, the desired TX signal dominates at the MRX output, and any distortion signals including the half clock spur have been buried under the dominated signal. Thus, it is difficult to detect the half clock spur. In the table above, the MRX has a low LO frequency (FLO_TX/2) by disabling the frequency doubler of the MRX, and the MRX still operates in the 6-phase mode. This means the down-conversion process of the MRX treats the half clock spur as a fundamental signal having a high fundamental signal conversion gain. By contrast, the down-conversion process of the MRX treats the desired TX signal as a second harmonic having a much lower conversion gain. The half clock spur has become a dominated signal at the output of the MRX. Such an arrangement makes the detection of the half clock spur much easier.

In a second implementation of the normal mode, the TX is configured to operate in a 3-phase mode. The MRX is configured to operate in the 6-phase mode. The TX and the MRX are configured to operate at a same LO frequency through disabling the first frequency doubler 1546.

For reducing the half clock spur, the TRX is configured to operate in a calibration mode. In a second implementation of the calibration mode, the TX is configured to operate in the 3-phase mode with a first LO frequency. The MRX is configured to operate in the 6-phase mode with a second LO frequency. The second LO frequency is equal to one half of the first LO frequency. The reduced LO frequency can be realized through disabling the second frequency doubler 1544. It should be noted that in the second implementation of the calibration mode, both the first frequency doubler 1546 and the second frequency doubler 1544 are disabled.

The second implementation of the normal mode and the calibration mode can be summarized by the following table:

| PATH/MODE | FREQUENCY DOUBLER | 6PHASE/3PHASE SELECT | LO FREQUENCY |
|---|---|---|---|
| TX | DISABLE | 3-PHASE | FLO_TX |
| MRX NORMAL OPERATION | ENABLE | 6-PHASE | FLO_MRX = FLO_TX |
| MRX HALF CLOCK SPUR CALIBRATION | DISABLE | 6-PHASE | FLO_MRX = FLO_TX/2 |

Similar to the first implementation of the calibration mode, this 3-phase configuration of the TX forces the MRX to treat the half clock spur as a fundamental signal, and the desired TX signal as a second harmonic signal, thus correctly determining the duty cycle error of the VCO signal.

Figure 16:
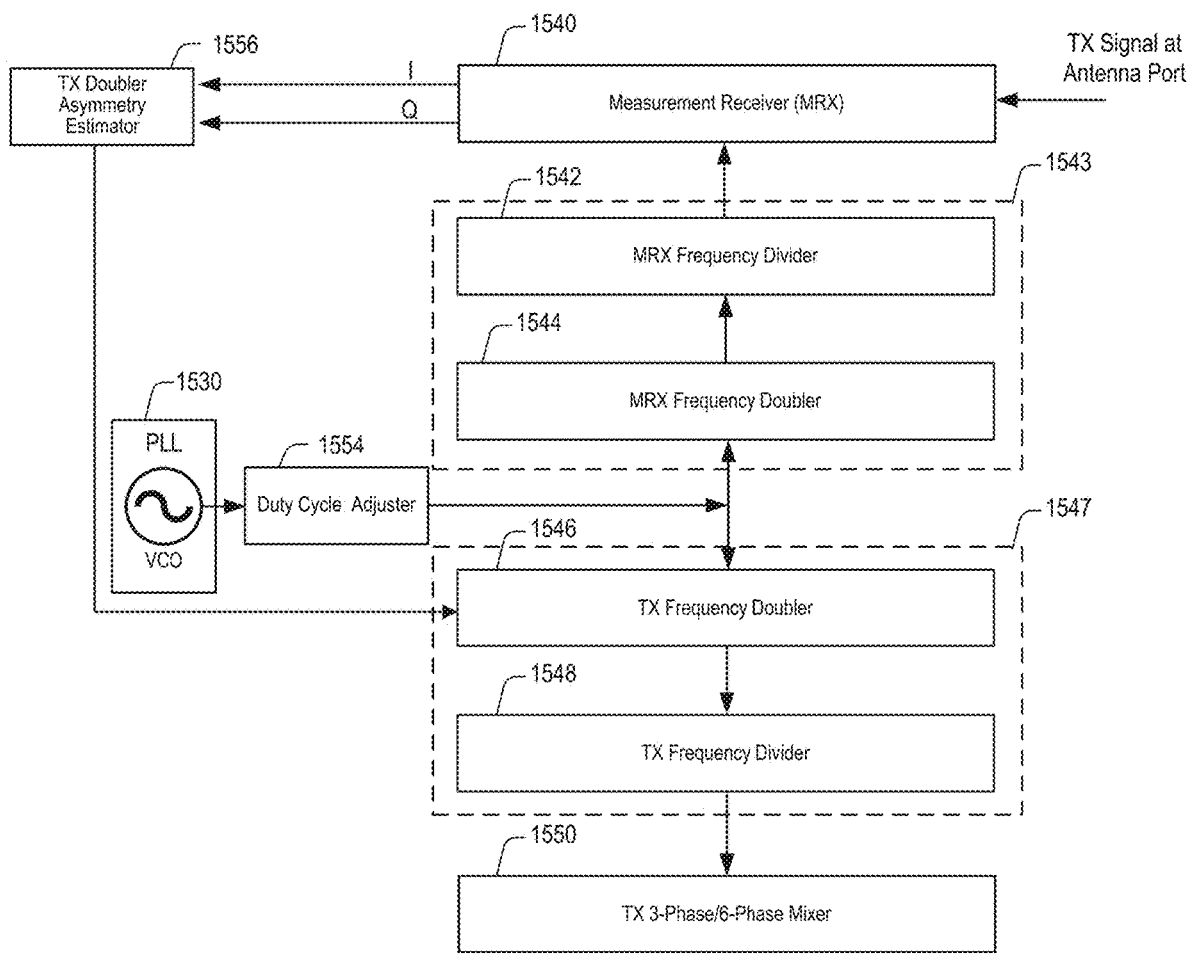
FIG. 16 illustrates an embodiment for reducing the second order counter-intermodulation in accordance with various embodiments of the present disclosure.

FIG. 16 illustrates an embodiment for reducing the second order counter-intermodulation in accordance with various embodiments of the present disclosure. The block diagram shown in FIG. 16 is similar to that shown in FIG. 15 except that the TX signal is tapped at an antenna port of the TRX, and an output of a TX doubler asymmetry estimator 1556 is used to adjust the symmetry of the first frequency doubler 1546.

Depending on the implementation of the frequency doubler, it may happen that the second order counter-intermodulation (CIM2n) may be generated due to non-perfect symmetry of the differential doubler circuit. The circuit implementation shown in FIG. 16 can add the ability to adjust the symmetry so as to lower CIM2n. In particular, the system shown in FIG. 16 can do some measurements and determine the adjustment needed to make the frequency doubler circuit as symmetrical as possible.

In the setup shown in FIG. 16, both the TX and the MRX are configured to operate in a 6-phase mode. The TX signal at the antenna port of the TRX is coupled back to the input of the MRX through a suitable coupler. After a down-conversion process through the MRX, the CIM2n can be measured from the digital I and Q measurement signals generated by the MRX. The most significant CIM2n is caused by the asymmetry of the first frequency doubler 1546. The TX doubler asymmetry estimator 1556 is configured to generate a symmetry adjustment code based on the digital I and Q measurement signals generated by the MRX. As shown in FIG. 16, the symmetry adjustment code is fed into the first frequency doubler 1546 for adjusting symmetry of the first frequency doubler 1546.

It should be noted that the input of the MRX is coupled to the antenna port of the TRX. At the antenna port, other distortions except CIM2n have been filtered down through the PA and post PA filters. In other words, the output of the MRX is dominated by the error caused by the asymmetry of the TX frequency doubler, thus making the measurement more effective in determining the symmetry of the TX frequency doubler. This principle of this effective measurement of CIM2n is also applicable to the second harmonic generated by the PA. This second harmonic content generated by the PA can be down-converted by the MRX to create a harmonic component located at the same frequency as the down-converted TX CIM2n distortion. However, there are a few rejection factors along the path from the PA to the MRX output, which make the PA generated harmonic component to be negligible when comparing to the TX CIM2n after the MRX down-conversion. These factors are: the PA naturally has a low second harmonic; the coupling point is at the antenna port which means the post PA filter will lower the level of the second harmonic generated by the PA; the 6-phase MRX down-conversion of the second harmonic generated by the PA is from a non-perfect circuit implementation. In other words, the conversion gain of the second harmonic generated by the PA is lower than that of the fundamental conversion gain. The TX CIM2n down conversion is of a fundamental conversion gain.

Figure 17:
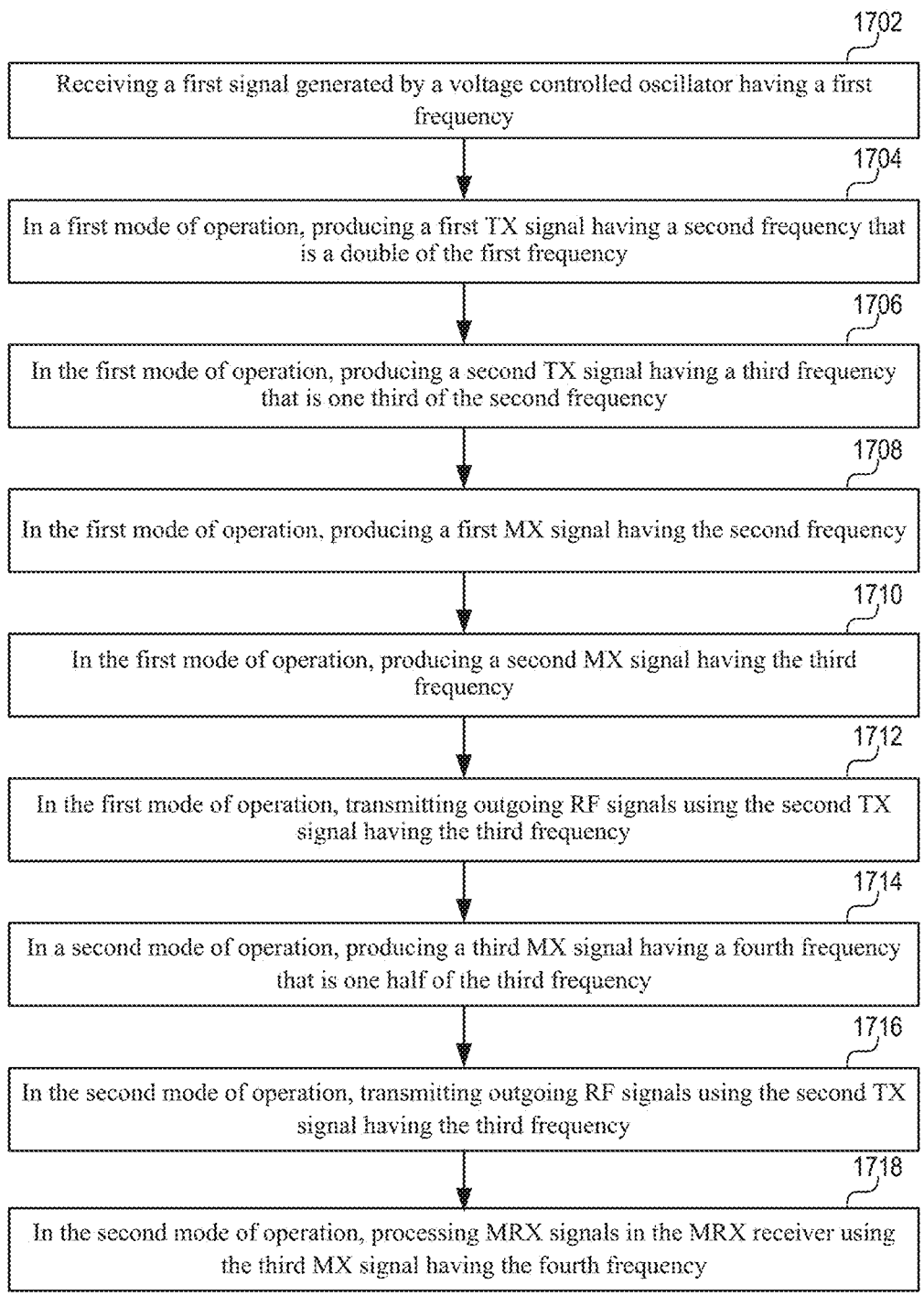
FIG. 17 illustrates a flow chart of a method for reducing the half clock spur in accordance with various embodiments of the present disclosure.

FIG. 17 illustrates a flow chart of a method for reducing the half clock spur in accordance with various embodiments of the present disclosure. This flowchart shown in FIG. 17 is merely an example, which should not unduly limit the scope of the claims. One of ordinary skill in the art would recognize many variations, alternatives, and modifications.

For example, various steps illustrated in FIG. 17 may be added, removed, replaced, rearranged and repeated.

A TRX comprises a TX and an MRX. Referring back to FIG. 15, the TRX comprises a TX frequency doubler, a TX frequency divider, an MRX frequency doubler and an MRX frequency divider. For reducing a half clock spur, the TRX may operate in a calibration mode. In the calibration mode, the MRX processes the received signals to determine the half clock spur level. Based on the detected half clock spur level, a duty cycle adjustment code is generated. The duty cycle adjustment code is used to adjust the duty cycle of the signal generated by the VCO.

At step 1702, a first signal is generated by the VCO and fed into the TX frequency doubler and the MRX frequency doubler. The first signal has a first frequency. In some embodiments, the first frequency is equal to 7.5 GHz.

At step 1704, the TRX is configured to operate in a first mode of operation. The first mode is a normal mode. In the first mode of operation, a first TX signal is generated by the TX frequency doubler. The first TX signal has a second frequency that is a double of the first frequency. In other words, the second frequency is equal to 15 GHz.

At step 1706, in the first mode of operation, a second TX signal is generated by the TX frequency divider. The second TX signal has a third frequency that is one third of the second frequency. In other words, the third frequency is equal to 5 GHz.

At step 1708, in the first mode of operation, a first MX signal is generated by the MRX frequency doubler. The first MX signal has the second frequency. As described at step 1704, the second frequency is equal to 15 GHz.

At step 1710, in the first mode of operation, a second MX signal is generated by the MRX frequency divider. The second MX signal has the third frequency. As described at step 1706, the third frequency is equal to 5 GHz.

At step 1712, in the first mode of operation, the ongoing RF signals are transmitted using the second TX signal having the third frequency. As described at step 1706, the third frequency is equal to 5 GHz. In the first mode, the MRX processing frequency is same as the transmitting frequency.

The TRX is configured to operate in a second mode of operation. The second mode of operation is the calibration mode for reducing the half clock spur in the TRX.

At step 1714, in the second mode of operation, a third MX signal is generated through bypassing the MRX doubler and sending the VCO signal to the MRX frequency divider directly. The third MX signal has a fourth frequency that is one half of the third frequency. In other word, the fourth frequency is equal to 2.5 GHz.

At step 1716, in the second mode of operation, the ongoing RF signals are transmitted using the second TX signal having the third frequency. As described at step 1706, the third frequency is equal to 5 GHz.

At step 1718, in the second mode of operation, the MRX signals are processed at the MRX using the third MX signal having the fourth frequency. As described at step 1714, the fourth frequency is equal to 2.5 GHz.

In the calibration mode, the MRX processing frequency is one half of the transmitting frequency. By reducing the MRX processing frequency, the half clock spur becomes a dominated signal in the MRX, thereby making the detection of the half clock spur easier.

In accordance with an embodiment, a method for calibration of a transceiver (TRX) comprising a transmitter (TX) and a measurement receiver (MRX) comprises producing a plurality of TX local oscillator (LO) signals by a first LO generator comprising a first frequency doubler and a first frequency divider, the first frequency doubler being configured to receive a voltage controlled oscillator (VCO) signal having a first frequency and generate a first signal fed into the first frequency divider, the first signal having a second frequency that is twice the first frequency, producing a plurality of MRX LO signals by a second LO generator comprising a second frequency doubler and a second frequency divider, the second frequency doubler being configured to receive the VCO signal and generate a second signal fed into the second frequency divider, the second signal having the second frequency, and in a calibration mode, configuring the TX to operate at a first LO frequency, and configuring the MRX to operate at a second LO frequency equal to the first frequency through disabling the second frequency doubler.

The method further comprises in the calibration mode, configuring the TX and the MRX to operate in a 6-phase mode, wherein the LO frequency of the MRX is reduced through bypassing the second frequency doubler.

The method further comprises in the calibration mode, configuring the TX to operate in a 3-phase mode through disabling the first frequency doubler, and configuring the MRX to operate in a 6-phase mode, wherein the second LO frequency of the MRX is one half of the first LO frequency of the TX.

The method further comprises in a normal mode, configuring the TX and the MRX to operate in a 6-phase mode with a same LO frequency.

The method further comprises in a normal mode, configuring the TX in a 3-phase mode and configuring the MRX to operate a 6-phase mode, wherein the first frequency doubler is disabled, and the TX and the MRX operate at a same LO frequency.

The method further comprises in the calibration mode, producing measurement signals including a half clock spur caused by a duty cycle error of the VCO signal, generating a duty cycle correction code based on the measurement signals, and adjusting a duty cycle of the VCO signal based on the duty cycle correction code.

The first frequency divider is configured to generate three LO signals in response to a 3-phase mode of the TX, and wherein the three LO signals are offset by 120 degrees from each other, and each of the three LO signals is of a duty cycle of about 33.3%. The first frequency divider is configured to generate six LO signals in response to a 6-phase mode of the TX, and wherein the six LO signals are offset by 60 degrees from each other, and each of the six LO signals is of a duty cycle of about 16.7%.

The MRX is a measurement receiver configured to receive a TX output signal tapped from an input of a power amplifier.

The VCO signal is generated by a voltage controlled oscillator in a phase lock loop. The VCO signal has a 50% duty cycle.

The method further comprises in the TX, converting digital in-phase and quadrature-phase signals to a first phase signal, a second phase signal and a third phase signal, through three digital-to-analog converters, converting the first phase signal, the second phase signal and the third phase signal into six phase signals offset by 60 degrees from each other, and producing, based on the six phase signals and the plurality of TX LO signals, an analog TX output signal fed into a power amplifier.

In accordance with another embodiment, a method for calibration of a transceiver (TRX) comprising a transmitter (TX) and a measurement receiver (MRX) comprises producing a plurality of TX local oscillator (LO) signals by a first LO generator comprising a first frequency doubler and a first frequency divider, the first frequency doubler being configured to receive a voltage controlled oscillator (VCO) signal having a first frequency and generate a first signal fed into the first frequency divider, the first signal having a second frequency that is twice the first frequency, producing a plurality of MRX LO signals by a second LO generator comprising a second frequency doubler and a second frequency divider, the second frequency doubler being configured to receive the VCO signal and generate a second signal fed into the second frequency divider, the second signal having the second frequency, in a calibration mode, configuring the TX and the MRX to operate at a same LO frequency, producing measurement signals including a second order counter-intermodulation (CIM2) signal caused by asymmetry of the first frequency doubler, and generating a symmetry adjustment code based on the measurement signals, and adjusting symmetry of the first frequency doubler based on the symmetry adjustment code.

The MRX is a measurement receiver configured to receive a TX output signal tapped from an antenna port of the TRX.

The TRX comprises a mixer, a power amplifier, a filter and the antenna port coupled in cascade, and wherein in the mixer, based on phase signals and the plurality of TX LO signals, an analog TX output signal is generated and fed into the power amplifier.

The method further comprises in the calibration mode, configuring the TX to operate in a 6-phase mode, wherein LO signals are offset by 60 degrees from each other, and each of the LO signals is of a duty cycle of about 16.7%.

The method further comprises in the calibration mode, configuring the TX to operate in a 3-phase mode, wherein LO signals are offset by 120 degrees from each other, and each of the LO signals is of a duty cycle of about 16.7%.

In accordance with yet another embodiment, a system comprising a transmitter (TX) and a measurement receiver (MRX) comprises a first local oscillator (LO) generator comprising a first frequency doubler and a first frequency divider, the first frequency doubler being configured to receive a voltage controlled oscillator (VCO) signal having a first frequency and generate a first signal fed into the first frequency divider, the first signal having a second frequency that is twice the first frequency, wherein the first frequency divider is configured to generate a plurality of TX LO signals, a second LO generator comprising a second frequency doubler and a second frequency divider, the second frequency doubler being configured to receive the VCO signal and generate a second signal fed into the second frequency divider, the second signal having the second frequency, wherein the second frequency divider is configured to generate a plurality of MRX LO signals, the TX configured to convert digital in-phase and quadrature-phase signals to a plurality of phase signals, and generate an analog TX output signal based on the plurality of phase signals and the plurality of TX LO signals, and the MRX configured to receive the analog TX output signal and generate measurement signals including distortion signals.

In a calibration mode for reducing a half clock spur, the TX and the MRX are configured to operate in a 6-phase mode, wherein an LO frequency of the MRX is one half of an LO frequency of the TX through disabling the second frequency doubler.

The system further comprises a duty cycle error estimation unit coupled to the MRX, wherein the duty cycle error estimation unit is configured to generate a duty cycle correction code based on the measurement signals, and adjust a duty cycle of the VCO signal based on the duty cycle correction code.

In a calibration mode for reducing a half clock spur, the TX is configured to operate in a 3-phase mode, and the MRX is configured to operate in a 6-phase mode, wherein an LO frequency of the MRX is one half of an LO frequency of the TX through disabling the first frequency doubler and the second frequency doubler.

The system further comprises a power amplifier and a filter coupled in cascade between the TX and an antenna port, wherein the analog TX output signal is tapped from an input of the power amplifier.

In accordance with yet another embodiment, a method for calibration of a transceiver (TRX) comprising a transmitter (TX) and a measurement receiver (MRX comprises receiving a first signal generated by a voltage controlled oscillator (VCO) having a first frequency, in a first mode of operation: producing a first TX signal having a second frequency that is a double of the first frequency, producing a second TX signal having a third frequency that is one third of the second frequency, producing a first MX signal having the second frequency, producing a second MX signal having the third frequency, and transmitting outgoing RF signals using the second TX signal having the third frequency, and in a second mode of operation: producing a third MX signal having a fourth frequency that is one half of the third frequency, transmitting outgoing RF signals using the second TX signal having the third frequency, and processing MRX signals in the MRX receiver using the third MX signal having the fourth frequency.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. The specification and drawings are, accordingly, to be regarded simply as an illustration of the disclosure as defined by the appended claims, and are contemplated to cover any and all modifications, variations, combinations or equivalents that fall within the scope of the present disclosure.

What is claimed is:

1. A method for calibration of a transceiver (TRX) comprising a transmitter (TX) and a measurement receiver (MRX), the method comprising:
   producing a plurality of TX local oscillator (LO) signals by a first LO generator comprising a first frequency doubler and a first frequency divider, the first frequency doubler being configured to receive a voltage controlled oscillator (VCO) signal having a first frequency and generate a first signal fed into the first frequency divider, the first signal having a second frequency that is twice the first frequency;

producing a plurality of MRX LO signals by a second LO generator comprising a second frequency doubler and a second frequency divider, the second frequency doubler being configured to receive the VCO signal and generate a second signal fed into the second frequency divider, the second signal having the second frequency; and in a calibration mode, configuring the TX to operate at a first LO frequency, and configuring the MRX to operate at a second LO frequency equal to the first frequency through disabling the second frequency doubler.

2. The method of claim 1, further comprising:
in the calibration mode, configuring the TX and the MRX to operate in a 6-phase mode, wherein the LO frequency of the MRX is reduced through bypassing the second frequency doubler.

3. The method of claim 1, further comprising:
in the calibration mode, configuring the TX to operate in a 3-phase mode through disabling the first frequency doubler, and configuring the MRX to operate in a 6-phase mode, wherein the second LO frequency of the MRX is one half of the first LO frequency of the TX.

4. The method of claim 1, further comprising:
in a normal mode, configuring the TX and the MRX to operate in a 6-phase mode with a same LO frequency.

5. The method of claim 1, further comprising:
in a normal mode, configuring the TX in a 3-phase mode and configuring the MRX to operate a 6-phase mode, wherein the first frequency doubler is disabled, and the TX and the MRX operate at a same LO frequency.

6. The method of claim 1, further comprising:
in the calibration mode, producing measurement signals including a half clock spur caused by a duty cycle error of the VCO signal;
generating a duty cycle correction code based on the measurement signals; and
adjusting a duty cycle of the VCO signal based on the duty cycle correction code.

7. The method of claim 1, wherein:
the first frequency divider is configured to generate three LO signals in response to a 3-phase mode of the TX, and wherein the three LO signals are offset by 120 degrees from each other, and each of the three LO signals is of a duty cycle of about 33.3%; and
the first frequency divider is configured to generate six LO signals in response to a 6-phase mode of the TX, and wherein the six LO signals are offset by 60 degrees from each other, and each of the six LO signals is of a duty cycle of about 16.7%.

8. The method of claim 1, wherein:
the MRX is a measurement receiver configured to receive a TX output signal tapped from an input of a power amplifier.

9. The method of claim 1, wherein:
the VCO signal is generated by a voltage controlled oscillator in a phase lock loop; and
the VCO signal has a 50% duty cycle.

10. The method of claim 1, further comprising:
in the TX, converting digital in-phase and quadrature-phase signals to a first phase signal, a second phase signal and a third phase signal;
through three digital-to-analog converters, converting the first phase signal, the second phase signal and the third phase signal into six phase signals offset by 60 degrees from each other; and producing, based on the six phase signals and the plurality of TX LO signals, an analog TX output signal fed into a power amplifier.

11. A method for calibration of a transceiver (TRX) comprising a transmitter (TX) and a measurement receiver (MRX), the method comprising:
producing a plurality of TX local oscillator (LO) signals by a first LO generator comprising a first frequency doubler and a first frequency divider, the first frequency doubler being configured to receive a voltage controlled oscillator (VCO) signal having a first frequency and generate a first signal fed into the first frequency divider, the first signal having a second frequency that is twice the first frequency;
producing a plurality of MRX LO signals by a second LO generator comprising a second frequency doubler and a second frequency divider, the second frequency doubler being configured to receive the VCO signal and generate a second signal fed into the second frequency divider, the second signal having the second frequency;
in a calibration mode, configuring the TX and the MRX to operate at a same LO frequency;
producing measurement signals including a second order counter-intermodulation (CIM2) signal caused by asymmetry of the first frequency doubler; and
generating a symmetry adjustment code based on the measurement signals; and
adjusting symmetry of the first frequency doubler based on the symmetry adjustment code.

12. The method of claim 11, wherein:
the MRX is a measurement receiver configured to receive a TX output signal tapped from an antenna port of the TRX.

13. The method of claim 12, wherein:
the TRX comprises a mixer, a power amplifier, a filter and the antenna port coupled in cascade, and wherein in the mixer, based on phase signals and the plurality of TX LO signals, an analog TX output signal is generated and fed into the power amplifier.

14. The method of claim 11, further comprising:
in the calibration mode, configuring the TX to operate in a 6-phase mode, wherein LO signals are offset by 60 degrees from each other, and each of the LO signals is of a duty cycle of about 16.7%.

15. The method of claim 11, further comprising:
in the calibration mode, configuring the TX to operate in a 3-phase mode, wherein LO signals are offset by 120 degrees from each other, and each of the LO signals is of a duty cycle of about 16.7%.

16. A system comprising a transmitter (TX) and a measurement receiver (MRX), the system comprising:
a first local oscillator (LO) generator comprising a first frequency doubler and a first frequency divider, the first frequency doubler being configured to receive a voltage controlled oscillator (VCO) signal having a first frequency and generate a first signal fed into the first frequency divider, the first signal having a second frequency that is twice the first frequency, wherein the first frequency divider is configured to generate a plurality of TX LO signals;
a second LO generator comprising a second frequency doubler and a second frequency divider, the second frequency doubler being configured to receive the VCO signal and generate a second signal fed into the second frequency divider, the second signal having the second frequency, wherein the second frequency divider is configured to generate a plurality of MRX LO signals;

the TX configured to convert digital in-phase and quadrature-phase signals to a plurality of phase signals, and generate an analog TX output signal based on the plurality of phase signals and the plurality of TX LO signals; and the MRX configured to receive the analog TX output signal and generate measurement signals including distortion signals.

17. The system of claim 16, wherein:
in a calibration mode for reducing a half clock spur, the TX and the MRX are configured to operate in a 6-phase mode, wherein an LO frequency of the MRX is one half of an LO frequency of the TX through disabling the second frequency doubler.

18. The system of claim 16, further comprising:
a duty cycle error estimation unit coupled to the MRX, wherein the duty cycle error estimation unit is configured to generate a duty cycle correction code based on the measurement signals, and adjust a duty cycle of the VCO signal based on the duty cycle correction code.

19. The system of claim 16, wherein:
in a calibration mode for reducing a half clock spur, the TX is configured to operate in a 3-phase mode, and the MRX is configured to operate in a 6-phase mode, wherein an LO frequency of the MRX is one half of an LO frequency of the TX through disabling the first frequency doubler and the second frequency doubler.

20. The system of claim 16, further comprising:
a power amplifier and a filter coupled in cascade between the TX and an antenna port, wherein the analog TX output signal is tapped from an input of the power amplifier.

21. A method for calibration of a transceiver (TRX) comprising a transmitter (TX) and a measurement receiver (MRX), the method comprising:
receiving a first signal generated by a voltage controlled oscillator (VCO) having a first frequency;
in a first mode of operation:
producing a first TX signal having a second frequency that is a double of the first frequency;
producing a second TX signal having a third frequency that is one third of the second frequency;
producing a first MX signal having the second frequency;
producing a second MX signal having the third frequency; and
transmitting outgoing RF signals using the second TX signal having the third frequency; and
in a second mode of operation:
producing a third MX signal having a fourth frequency that is one half of the third frequency;
transmitting outgoing RF signals using the second TX signal having the third frequency; and
processing MRX signals in the MRX receiver using the third MX signal having the fourth frequency.

* * * * *

UNITED STATES PATENT AND TRADEMARK OFFICE
CERTIFICATE OF CORRECTION

PATENT NO. : 11,881,877 B2
APPLICATION NO. : 17/653521
DATED : January 23, 2024
INVENTOR(S) : Jiang et al.

It is certified that error appears in the above-identified patent and that said Letters Patent is hereby corrected as shown below:

On the Title Page

Item (72), in Column 1, in "Inventors", Line 1, delete "Kernsersville" and insert -- Kernersville --.

Signed and Sealed this
Thirtieth Day of April, 2024

Katherine Kelly Vidal
*Director of the United States Patent and Trademark Office*